United States Patent

Mori et al.

[15] 3,681,616

[45] Aug. 1, 1972

[54] LOGIC CIRCUITS

[72] Inventors: Ryoichi Mori; Hiroaki Tajima; Yoshio Tsuji; Noriaki Sanechika, all of Tokyo-to, Japan

[73] Assignee: Kogyo Gijutsuin, Tokyo-to, Japan

[22] Filed: Oct. 31, 1969

[21] Appl. No.: 872,824

[30] Foreign Application Priority Data

Nov. 1, 1968 Japan..........................43/79330

[52] U.S. Cl...................................307/218, 307/254

[51] Int. Cl..............................................H03k 17/00

[58] Field of Search..............307/203, 207, 215, 218; 330/30 D

[56] References Cited

UNITED STATES PATENTS

| | | | |
|---|---|---|---|
| 3,475,622 | 10/1969 | Andersen et al | 330/30 |
| 3,446,989 | 5/1969 | Allen et al. | 307/215 |
| 3,508,076 | 4/1970 | Winder | 330/30 |

*Primary Examiner*—John S. Heyman
*Assistant Examiner*—B. P. Davis
*Attorney*—Holman & Stern

[57] ABSTRACT

A novel type of logic circuit, the output binary logic functions or signals thereof being defined according to whether each of the output voltage differences is positive or negative, is so organized that the logic circuit comprises a plurality of current switches to each of which is applied an input signal composed of a pair of voltages, and a binary output of 0 and 1 is delivered therefrom, at most two circuit elements wherein the binary outputs from said plurality of current switches are added in a linear manner, a plurality of circuit positions the potentials of which are in a linear relation to the resultant voltage obtained in said circuit elements, and means for producing voltage differences between said plurality of circuit positions, whereby a plurality of said binary logic functions or signals are simultaneously obtained. In another aspect, a plurality of reference potentials may also be provided, and the voltage differences between any of said plurality of circuit positions and said plurality of reference potentials may be employed as the outputs of the logic circuit.

1 Claim, 36 Drawing Figures

FIG. 32

| S | 0 | 1 | | j | | m-1 | m | μ |
|---|---|---|---|---|---|---|---|---|
| V1',n | 1 | -1 | | -2j+1 | | -2m+3 | -2m+1 | 1 |
| V1',n-1 | 3 | 1 | | -2j+3 | | -2m+5 | -2m+3 | 2 |
| | | | | | | | | |
| V1',k | m-2k+2 | m-2k | | m-2k-2j+2 | | -m-2k+4 | -m-2k+2 | $\frac{m}{2}-k+\frac{3}{2}$ |
| | | | | | | | | |
| V1',2 | m-2 | m-4 | | m-2j-2 | | -m | -m-2 | $\frac{m}{2}-\frac{1}{2}$ |
| V1',1 | m | m-2 | | m-2j | | -m+2 | -m | $\frac{m}{2}+\frac{1}{2}$ |
| V2',1 | m+2 | m | | m-2j+2 | | -m+4 | -m+2 | $\frac{m}{2}+\frac{3}{2}$ |
| | | | | | | | | |
| Vk',1 | m+2k-2 | m+2k-4 | | m+2k-2j-2 | | -m+2k | -m+2k-2 | $\frac{m}{2}+k-\frac{1}{2}$ |
| | | | | | | | | |
| V(n-1)',1 | 2m-3 | 2m-5 | | 2m-2j-3 | | -1 | -3 | m-1 |
| Vn',1 | 2m-1 | 2m-3 | | 2m-2j-1 | | 1 | -1 | m |

UNITS EMPLOYED FOR ALL VALUES IN THIS TABLE ARE VOLTS.

TABLE 1, WHEREIN m IS AN ODD NUMBER, $n=\frac{m+1}{2}$, $l=0$,

FIG. 33

| S | 0 | 1 | j | m−1 | m | μ |
|---|---|---|---|---|---|---|
| $V1',n$ | 1 | −1 | −2j+1 | −2m+3 | −2m+1 | 1 |
| $V1',n-1$ | 3 | 1 | −2j+3 | −2m+5 | −2m+3 | 2 |
| | | | | | | |
| $V1',k$ | m−2k+2 | m−2k+1 | m−2k−2j+3 | −m−2k+5 | −m−2k+3 | $\frac{m}{2}-k+2$ |
| | | | | | | |
| $V1',2$ | m−1 | m−3 | m−2j−1 | −m+1 | −m−1 | $\frac{m}{2}$ |
| $V2',1$ | m+1 | m−1 | m−2j+1 | −m+3 | −m+1 | $\frac{m}{2}+1$ |
| | | | | | | |
| $Vk',1$ | m+2k−3 | m+2k−5 | m+2k−2j−3 | −m+2k−1 | −m+2k−3 | $\frac{m}{2}+k-1$ |
| | | | | | | |
| $V(n-1)',1$ | 2m−3 | m−5 | 2m−2j−3 | −1 | −3 | m−1 |
| $Vn',1$ | 2m−1 | 2m−3 | 2m−2j−1 | 1 | −1 | m |

UNITS EMPLOYED FOR ALL VALUES IN THIS TABLE ARE VOLTS.

TABLE 2, WHEREIN m IS AN EVEN NUMBER, $n=\frac{m}{2}+1$, AND $l=0$,

FIG. 34

| S | 0 | 1 | j | m-1 | m | $\mu$ |
|---|---|---|---|---|---|---|
| $V_{1,1}$ | $\frac{1}{2}$ | $-\frac{1}{2}$ | $-j+\frac{1}{2}$ | $-m+\frac{3}{2}$ | $-m+\frac{1}{2}$ | 1 |
| $V_{2,1}$ | $\frac{3}{2}$ | $\frac{1}{2}$ | $-j+\frac{3}{2}$ | $-m+\frac{5}{2}$ | $-m+\frac{3}{2}$ | 2 |
| | | | | | | |
| $V_{h,1}$ | $h-\frac{1}{2}$ | $h-\frac{3}{2}$ | $h-j-\frac{1}{2}$ | $-m+h+\frac{1}{2}$ | $-m+h-\frac{1}{2}$ | h |
| | | | | | | |
| $V_{\ell-1,1}$ | $\frac{m}{2}-\frac{3}{2}$ | $\frac{m}{2}-\frac{5}{2}$ | $\frac{m}{2}-j-\frac{3}{2}$ | $-\frac{m}{2}-\frac{1}{2}$ | $-\frac{m}{2}-\frac{3}{2}$ | $\frac{m}{2}-1$ |
| $V_{\ell,1}$ | $\frac{m}{2}-\frac{1}{2}$ | $\frac{m}{2}-\frac{3}{2}$ | $\frac{m}{2}-j-\frac{1}{2}$ | $-\frac{m}{2}+\frac{1}{2}$ | $-\frac{m}{2}-\frac{1}{2}$ | $\frac{m}{2}$ |
| $V'_{1,\ell}$ | $\frac{m}{2}+\frac{1}{2}$ | $\frac{m}{2}-\frac{1}{2}$ | $\frac{m}{2}-j+\frac{1}{2}$ | $-\frac{m}{2}+\frac{3}{2}$ | $-\frac{m}{2}+\frac{1}{2}$ | $\frac{m}{2}+1$ |
| $V'_{1,\ell-1}$ | $\frac{m}{2}+\frac{3}{2}$ | $\frac{m}{2}+\frac{1}{2}$ | $\frac{m}{2}-j+\frac{3}{2}$ | $-\frac{m}{2}+\frac{5}{2}$ | $-\frac{m}{2}+\frac{3}{2}$ | $\frac{m}{2}+2$ |
| | | | | | | |
| $V'_{1,h}$ | $m-h+\frac{1}{2}$ | $m-h-\frac{1}{2}$ | $m-h-j+\frac{1}{2}$ | $-h+\frac{3}{2}$ | $-h+\frac{1}{2}$ | $m-h+1$ |
| | | | | | | |
| $V'_{1,2}$ | $m-\frac{3}{2}$ | $m-\frac{5}{2}$ | $m-j-\frac{3}{2}$ | $-\frac{1}{2}$ | $-\frac{3}{2}$ | $m-1$ |
| $V'_{1,1}$ | $m-\frac{1}{2}$ | $m-\frac{3}{2}$ | $m-j-\frac{1}{2}$ | $\frac{1}{2}$ | $-\frac{1}{2}$ | m |

UNITS EMPLOYED FOR ALL VALUES IN THIS TABLE ARE VOLTS.

TABLE 3. WHEREIN m IS AN EVEN NUMBER, n=1, AND $\ell=\frac{m}{2}$

FIG. 35

| S | 0 | 1 | j | m−1 | m | μ |
|---|---|---|---|---|---|---|
| $V_{1,1}$ | $\frac{1}{2}$ | $-\frac{1}{2}$ | $-j+\frac{1}{2}$ | $-m+\frac{3}{2}$ | $-m-\frac{1}{2}$ | 1 |
| $V_{2,1}$ | $\frac{3}{2}$ | $\frac{1}{2}$ | $-j+\frac{3}{2}$ | $-m+\frac{5}{2}$ | $-m+\frac{3}{2}$ | 2 |
| $V_{h,1}$ | $h-\frac{1}{2}$ | $h-\frac{3}{2}$ | $h-j-\frac{1}{2}$ | $-m+h+\frac{1}{2}$ | $-m+h-\frac{1}{2}$ | h |
| $V_{l-1,1}$ | $\frac{m}{2}-1$ | $\frac{m}{2}-2$ | $\frac{m}{2}-j-1$ | $-\frac{m}{2}$ | $-\frac{m}{2}-1$ | $\frac{m}{2}-\frac{1}{2}$ |
| $V_{l,1}=V'_{1,l}$ | $\frac{m}{2}$ | $\frac{m}{2}-1$ | $\frac{m}{2}-j$ | $-\frac{m}{2}+1$ | $-\frac{m}{2}$ | $\frac{m}{2}+\frac{1}{2}$ |
| $V'_{1,l-1}$ | $\frac{m}{2}+1$ | $\frac{m}{2}$ | $\frac{m}{2}-j+1$ | $-\frac{m}{2}+2$ | $-\frac{m}{2}+1$ | $\frac{m}{2}+\frac{3}{2}$ |
| $V'_{1,h}$ | $m-h+\frac{1}{2}$ | $m-h-\frac{1}{2}$ | $m-h-j+\frac{1}{2}$ | $-h+\frac{3}{2}$ | $-h+\frac{1}{2}$ | $m-h+1$ |
| $V'_{1,2}$ | $m-\frac{3}{2}$ | $m-\frac{5}{2}$ | $m-j-\frac{3}{2}$ | $-\frac{1}{2}$ | $-\frac{3}{2}$ | $m-r$ |
| $V'_{1,1}$ | $m-\frac{1}{2}$ | $m-\frac{3}{2}$ | $m-j-\frac{1}{2}$ | $\frac{1}{2}$ | $-\frac{1}{2}$ | m |

UNITS EMPLOYED FOR ALL VALUES IN THIS TABLE ARE VOLTS.
TABLE 4, WHEREIN m IS AN ODD NUMBER, $n=1$, AND, $l=\frac{m+1}{2}$

FIG. 36

| S | 0 | 1 | | j | | m−1 | m | μ |
|---|---|---|---|---|---|---|---|---|
| $V_{1,1}$ | $\frac{1}{2}$ | $-\frac{1}{2}$ | | $-j+\frac{1}{2}$ | | $-m+\frac{3}{2}$ | $-m+\frac{1}{2}$ | 1 |
| $V_{2,1}$ | $\frac{3}{2}$ | $\frac{1}{2}$ | | $-j-\frac{3}{2}$ | | $-m-\frac{5}{2}$ | $-m+\frac{3}{2}$ | 2 |
| | | | | | | | | |
| $V_{h,1}$ | $h-\frac{1}{2}$ | $h-\frac{3}{2}$ | | $h-j-\frac{1}{2}$ | | $-m+h+\frac{1}{2}$ | $-m+h-\frac{1}{2}$ | h |
| | | | | | | | | |
| $V_{l-1,1}$ | $m-\frac{3}{2}$ | $m-\frac{5}{2}$ | | $m-j-\frac{3}{2}$ | | $-\frac{1}{2}$ | $-\frac{3}{2}$ | m−1 |
| $V_{l,1}$ | $m-\frac{1}{2}$ | $m-\frac{3}{2}$ | | $m-j-\frac{1}{2}$ | | $\frac{1}{2}$ | $-\frac{1}{2}$ | m |

UNITS EMPLOYED FOR ALL VALUES IN THIS TABLE ARE VOLTS.
TABLE 5, WHEREIN m IS AN ANY OF ODD OR EVEN NUMBER, $n=1$, AND $l=m$.

LOGIC CIRCUITS

BACKGROUND OF THE INVENTION

This invention relates generally to logic circuits, and more particularly to a type thereof wherein a plurality of output logic functions can be simultaneously obtained from a basic logic circuit (hereinafter called the "multi-output" feature), and a plurality of logic signals can be superposedly obtained from the output line or lines of the basic logic circuit (hereinafter called the "-multiplexity" feature).

In the ordinary case, a large and complicated logic circuit is organized to employ a comparatively few kinds of basic logic circuits or elements. Some of the essential requirements to be satisfied by those basic logic circuits or elements are as follows.

1. Any desired logic circuits should be obtainable from the combination of the basic logic circuits (versatility).

2. The required number and kinds of the fundamental logic circuits should be minimal, and interconnection therebetween should not be excessively complicated.

3. The basic logic circuits or elements should be of sufficient quality with respect to the operation period, power consumption, required space, weight, and the reliability.

4. The method of synthesis of the basic logic circuits and elements must be simple and easy.

Basic logic circuits or elements heretofore employed include: relays, DTL, TTL, etc., wherein AND, OR, and NOT logic elements and also circuits having higher functional density such as NAND, NOR, are employed; or parametrons, RTL, diode coupled logics, tunnel-diode coupled logics, or the like, which are based on the "Threshold logic" (or a "majority decision logic").

The "threshold logic" is not contradictory to the above described AND-OR logic but is capable of including the latter therein. Furthermore, each of the AND, OR, NAND, NOR, etc., can be considered to be a "threshold logic," and, in many cases, a single "threshold logic" can replace a complicated combination of AND-OR when the number of inputs thereof is increased. Accordingly, the threshold logic is superior to the AND-OR logic circuits or elements in view of the requirements (2) and (3) set forth above, but the problem of the method synthesis of logic circuits as described in requirement (4) has not yet been completely solved, and, moreover, there are problems of the noise margin, accuracy of the parts, etc., arise along with increased number of the input variables.

SUMMARY OF THE INVENTION

Therefore, the primary object of the present invention is to provide a novel type of basic logic circuit wherein the above described disadvantages of the conventional logic circuits of the class referred to above are completely eliminated.

Another object of the invention is to provide a novel type of basic logic circuit which possesses the above described "multi-output" feature and the "multiplexity feature" simultaneously on the output line.

Still another object of the present invention is to provide a novel type of basic logic circuit which can easily realize required logic functions, thus decreasing the required number of the basic logic circuits.

Still another object of the invention is to provide a novel type of basic logic circuit, which is in itself a "threshold logic circuit," wherein the threshold value can be varied easily and the logic signals may be formed by positive or negative differential voltages between a plurality of output points of the logic circuits.

Still another object of the invention is to provide a novel type of basic logic circuit whereby negations of the output signals may be easily obtained.

Still another object of the invention is to provide a novel type of logic circuit which is in itself a "multiplex median logic" circuit, whereby whole sets of isobaric functions can be simultaneously obtained.

Still another object of the invention is to provide a novel logic circuit wherein the large number of the outputs are obtained between various output points thereof or between these output points and a plurality of reference voltage points, and, by a combination of a least number of such logic circuits, various kinds of logic functions can be obtained.

These and other objects of the present invention can be achieved by the adoption of a novel type of basic logic circuit and a combination thereof, said basic logic circuit comprising a plurality of current switches to each of which is applied an input signal composed of a pair of voltages, and from each of which a binary output of 0 or 1 is delivered to at most two circuit elements wherein said binary outputs from said plurality of current switches are added in a linear or a partially linear manner, a plurality of circuit positions each having a potential linearly related to the added output in either of said at most two circuit elements or a potential obtained from a reference potential source, and means for producing voltage differences between the plurality of circuit positions, whereby a plurality of said logic functions or signals can be obtained simultaneously from said logic circuit.

The nature, principle, and utility of the invention will be more clearly apparent from the following detailed description with respect to preferred embodiments thereof when read in conjunction with the accompanying drawings, wherein like parts are designated by like reference numerals and characters.

BRIEF DESCRIPTION OF THE DRAWING

In the drawings:

FIGS. 32 through 36 are tables for explaining the operation of the logic circuits according to the present invention.

DETAILED DESCRIPTION

Prior to an explanation of the theoretical principle of the present invention, some of the symbols employed in the explanation will be defined as follows.

$$S^m(x_1, x_2, \ldots, x_j, \ldots x_m) \equiv \sum_{j=1}^{m} x_j \quad (1)$$

$$M_t^m(x_1, x_2, \ldots, x_j, \ldots x_m) \equiv \begin{cases} 1 \text{ when } S_m \geqq t \\ 0 \text{ when } S_m < t \end{cases} \quad (2)$$

$$N_t^m(x_1, x_2, \ldots, x_j, \ldots x_m) \equiv \begin{cases} 1 \text{ when } S_m = t \\ 0 \text{ when } S_m \neq t \end{cases} \quad (3)$$

wherein: $x_j$ is a variable which can take only one of two values 0 and 1; and $j$, $t$, and $m$ are integers having a relation of $1 \leqq j \leqq m$.

Unless otherwise noted, $S$, $Mt$, and $Nt$ will be hereinafter employed as abbreviations of the above described functions $S^m$, $M_t^m$, and $N_t^m$. More specifically, S represents an algebraic function which can take an integer value of 0 through $m$. In contrast, all of the variables or functions, such as $x_j$, $M_t$, and $N_t$, which can take merely either one of two values 0 and 1, are called logic variable or logic functions. When a logic variable or a logic function is represented by $\alpha$, the negation of such a variable or function is designated by $\bar{\alpha}$. Unless otherwise noted, a point in the following description designated by a symbol $\beta$ is considered to be a terminal $\beta$, and the potential of the terminal $\beta$ is expressed as $V_\beta$. Otherwise, when $\gamma$ designates a two-terminal element, a current flowing through the element is assumed to be $I_\gamma$, and a voltage across the terminals of the element is designated by $V_\gamma$.

Figure 1:
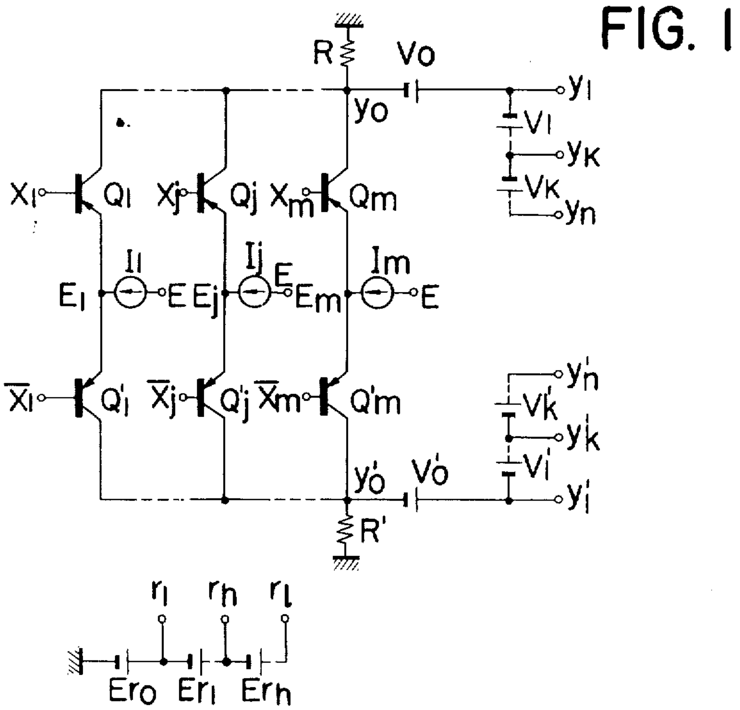
FIG. 1 is a schematic connection diagram for an explanation of the principle of the present invention.

In FIG. 1, it is assumed that $x_j$ represent a logic variable, and it is also assumed that when $Vx_j < V\bar{x}_j$, $x_j = 1$, and when $Vx_j > V\bar{x}_j$, $x_j = 0$.

Then, the value of $x_j$ cannot be determined merely by the value of $Vx_j$. However, since the circuit is completely in a symmetrical relation when it is observed from the terminal $\bar{x}_j$, $x_j$, and $\bar{x}_j$ are employed as shown in FIG. 1, and $x_j$ and $\bar{x}_j$ are considered to be designating simultaneously the terminals ans also the logic variables applied to these terminals, because no confusion will occur from these duplicated definitions.

Unless otherwise specified, the characters $Q_1, Q_2, \ldots Q_m$ and $Q'_1, Q'_2, \ldots, Q'_m$ in FIG. 1 are assumed to be transistors of equivalent characteristics, and each of the characters $I_1, I_2, \ldots I_m$; $V_0, V_1, \ldots V_{n-1}$ and $V'_0, V'_1, \ldots V'_{n-1}$; $R$ and $R'$ are assumed to be not only constant current sources, constant voltage sources and resistors, respectively, but also to designate the values of these current or voltage sources and resistors. Furthermore, it is also assumed that $$I = I_j > 0 \text{ wherein } 1 \leq j \leq m \quad (4)$$

$$R = R' > 0 \quad (5)$$

$$V_k = V'_k > 0 \text{ wherein } 0 \leq k \leq n-1 \quad (6)$$

Referring again to FIG. 1, $Q_j$ and $Q'_j$ are a pair of transistors having a common emitter connecting point $E_j$ and formed into a current switch. Current $I_j$ flows into the emitter connecting point $E_j$, and when $x_j = 1$, the current $I_j$ passes through the transistor $Q_j$ to the collector $y_0$ and then to the resistor $R$, and when $x_j = 0$, the current $I_j$ passes through the transistor $Q'_j$ to the collector $y'_0$ and then to the resistor $R'$.

Now, it will be assumed that the current amplification factor $h_{FE}$ for the grounded emitter and also the internal resistance of the collector of each of the transistors are sufficiently large, and that the influence of the outside loads connected to the terminals $y_1, \ldots y_n$ and terminals $y'_1, y'_2, \ldots y'_n$ are sufficiently little, and V is defined as $$V \equiv IR \quad (7)$$

and, when the above described function S is employed, $$V_{y_1} = V_{y_0} + V_0 = SV + V_0 \quad (8)$$

$$V_{y'_1} = V_{y'_0} + V'_0 = (m-s)\, V + V_0 \quad (9)$$

Now the following five fundamental cases will be considered.

i. When $m$ is an odd number and $n = (m+1)/2$, $l = 0$, and $$V_1 = V_2 = \ldots = V_k = \ldots = V_{n-1} = 2V. \quad (10)$$

Then, it is apparent that $$V_{y_k} = V_{y_1} + 2(k-1)\, V \quad (11)$$

$$V_{y'_k} = V_{y'_1} = V_y + 2(k-1)\, V \quad (12)$$

When Equations (8), (9) are substituted into Equations (11), (12), $$V_{y_k} = (S+2k+2)\, V + V_0 \quad (13)$$

$$V_{y'_k} = (m-S+2k-2)\, V + V_0 \quad (14)$$

When, with the definitions $$V_{k',1} = V_{y'_k} - V_{y_1} \quad (15)$$

$$V_{1',k} = V_{y'_1} - V_{y_k} \quad (16)$$

the relations (13), (14) are substituted in the above Equations (15), (16), $$V_{k',1} = (-2S+m+2k-2)\, V \quad (17)$$

$$V_{1',k} = (-2S+m-2k+2)\, V \quad (18)$$

are obtained. When the values of $V_{1',k}$ and $V_{k',1}$ are tabulated against all of the values which can be taken by $S$, that is 0 and $m$, and all of the values which can be taken by $k$, that is 1 to $n$, the table in FIG. 32 is obtained.

ii. In the case where $m$ is an even number, $n = (m/2) + 1$, $l = 0$ and $$V_1 = V \quad (19)$$

$$V_2 = V_3 \ldots = V_k = \ldots = V_{n-1} = 2V \ldots \quad (20)$$

Then, it is apparent that $$V_{y_k} = V_y + (2k-2)\, V \text{ wherein } 2 \leqq k \leqq n \quad (21)$$

$$V_{y'_k} = V_{y'_1} + (2k-3)\, V \text{ wherein } 2 \leqq k \leqq n \quad (22)$$

whereby, as in the case of (i), $$V_{k',1} = (-2S+m+2k-3)\, V, 2 \leqq k \leqq n \quad (23)$$

$$V_{1'} = (-2S+m-2k+3)\, V, 2 \leqq k \leqq n \quad (24)$$

Thus, the results can be tabulated as in FIG. 33.

iii. In the case where $m$ is an even number, $n = 1$, and $l = m/2$, it is assumed that $$E_{r_0} = V_0 + ½V \quad (25)$$

$$V = E_{r_1} = E_{r_2} = \ldots = E_{r_l} = \ldots = E_{r_{l-1}} \quad (26)$$

then obviously, $$V_{r_h} = V_o + (h - \tfrac{1}{2})V,\ 1 \leqq h \leqq l \qquad (27)$$

assuming that $$V_{h,1} \equiv V_{r_h} - V_{y_1}, \qquad (28)$$

$$V_{1',h} \equiv V_{y'} - V_{r_h}, \qquad (29)$$

and substituting Eqs. (8), (9), (27) in the above equations, $$V_{h,1} = (-S + h - \tfrac{1}{2})\, V \qquad (30)$$

$$V_{1,h} = (-S + m - h + \tfrac{1}{2})\, V \qquad (31)$$

When the values of $V_{h,1}$ and $V_{l',h}$ are tabulated against all of the values which can be taken by $S$, that is from 0 to $m$, and all of the values which can be taken by $h$, that is from 1 to $l$, the results are shown in the table shown in FIG. 34.

iv. In the case where Eqs. (25) through (31) are satisfied, but $m$ is an odd number, $n = 1$, and $l = (m+1)/2$, then, the results can be tabulated as in FIG. 35.

v. In the case where Eqs. (25) through (31) are satisfied, but $m$ can be either of even or odd number and $n = 1$, $l = m$, then, the results can be tabulated as in FIG. 36.

It is apparent that each of the tables in FIGS. 32 through 36 has $m$ rows and $m + 1$ columns. Herein, a function $W\mu(S)$ is so defined that the value thereof is 1 when the value of each row considered to be a function of $S$ is negative, and it is equal to 0 when the value of the row considered to be a function of $S$ is positive. In the function, $\mu$ represents the number of a considered row. More specifically, $W_1(S)$ represents the function corresponding to the first row of the tables, and $W_m(S)$ represents the function corresponding to the last row of the tables. Thus defining the function $W\mu(S)$, it will be apparent that the function $W\mu(S)$ is always equal to the previously defined function $M\mu$ in each of the tables of FIGS. 32 through 36 in view of the Eq. (2).

Since these tables represent the results of the above described cases (i) through (v), each of the voltages indicated in the most leftward columns in these tables is a voltage difference between two output terminals or a voltage difference between an output terminal and a reference potential terminal. As a result, a binary logic signal defined in accordance with whether each of the voltage differences is positive or whether it is negative can be constituted by each of these voltage differences. Since it is apparent that the sign of the voltage difference can be reversed by reversing the terminal connections, it should be noted that when a logic function is obtained, the negation of the logic function is also obtained.

Taking the production errors, noises, and similar variable factors into consideration, the minimum value of the difference voltages, which is required for driving the next stages, is assumed to be $V_{min}$.

Because the absolute value of each of the voltages indicated in Tables 1 and 2 is always not less than $V$, the relation $$V \geq V_{min} \qquad (32)$$

will give a required magnitude of $V$ for the cases of (i) and (ii). Since the absolute value of each of the voltages in Tables 3 through 5 is always not less than $\tfrac{1}{2}V$, the relation $$V \geq 2V_{min} \qquad (33)$$

will give a required magnitude of $V$ for the cases of (iii) through (v).

Accordingly, from the data set forth in these tables, it is apparent that the circuit according to the present invention can simultaneously create $2m$ logic functions consisting of $M_1$ through $M_m$ and also negations thereof in any of the cases of the above described (i) through (v).

On the other hand, it can be easily verified that any function symmetrical with respect to an input $x_j$ is also a function of S alone. For this reason, it will be apparent that the functions $M_1$ through $M_m$ and also $\overline{M}_1$ through $\overline{M}_m$, which are symmetrical and monotonic functions with respect to the input $x_j$ can all be obtained simultaneously from the single circuit according to the present invention. As will be apparent from the above description, the values of the constant voltage sources $V_o$ and $V'_o$ have no explicit relation to the logic operation of the circuit. However, for the purpose of enabling the circuit according to the present invention to maintain the relations defined by Equations (8) and (9), sufficiently high internal impedances are required for the current switches, and in order to satisfy this condition, a level shift voltage $V_o$ is sometimes required. For this reason, the level shift voltage $V_o$ will now be described hereinbelow.

In FIG. 1, if it is desired to maintain a sufficiently high internal impedance for the output of a transistor $Q_j$, the voltage $V_{y_o} - V_{x_j}$ applied to the collector junction should be negative or should be a positive potential not exceeding a small value $V'_F$. That is, $$V_{y_o} - V_x \leqq V'_F \qquad (34)$$

A condition under which Equation (34) is satisfied when $V_{y_o}$ is at its maximum value and $V_{x_j}$ is at its minimum value can be obtained as follows. The maximum value of $V_{y_o}$ is obviously equal to $mV$ except when a clipping circuit is employed as will be described hereinafter, and the minimum value of $V_{x_j}$ will be equal to $V_o$ when the voltage $V_{x_j}$ is provided from an output point of another circuit having a organization similar to that shown in FIG. 1.

With these values substituted in Equation (34), $$mV - V_o \leqq V'_F$$

whereby $$V_o \geqq mV - V'_F \qquad (35)$$

is the required condition. For instance, when $m = 4$, $V = 0.9$ volts, and $V'_F = 0.3$ volts, a relation of $V_o \geqq 3.3$ volts is obtained.

Various elements employed in the circuit according to the present invention will now be described in more detail.

Since the principle of the present invention has been made apparent, each element in FIG. 1 should be realized in some way for realization of the circuit. However, the number of the circuit elements indicated in FIG. 1 is great, and the methods for realizing these circuit elements are also extremely variant as described hereinafter, so that the description of all of the combinations of such methods is not practicable. For this reason, some of the typical examples of the methods for the realization of each of the elements in FIG. 1 will be indicated first, and thereafter some examples of the actual design of the whole circuit will be set forth.

Figure 2:
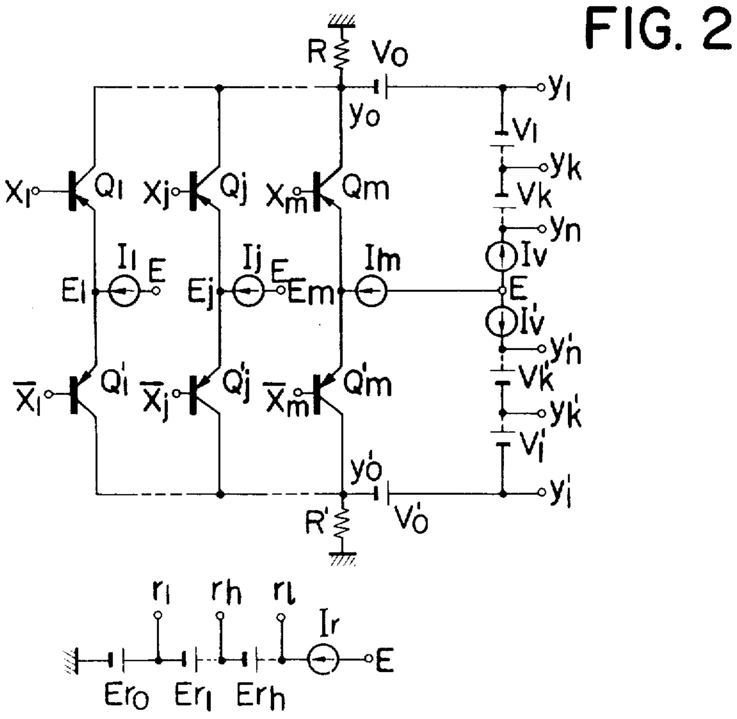
FIGS. 2 through 11, 13, 14, 18, 21, 22, 24, 25, and 26 are schematic connection diagrams showing various examples of the logic circuits according to the present invention.

For the realization of the constant voltage sources from $V_o$ to $V_{n-1}$, from $V'_o$ to $V'_{n-1}$, and from $E_{r_o}$ to $E_{r_{i-1}}$, it is possible to employ voltage drops in various elements such as resistors, diodes, zener diodes, or the forward voltage drops between the base and emitter of emitter-followers, or various combinations thereof. The constant current sources required for the realization of these constant voltage sources are designated by $I_v$, $I'_v$, and $I_r$ and these are indicated in FIG. 2. In this case, a voltage drop $I_vR$ is added to the voltage drops $V_{y_0}$ and $V'_{y_0}$. However, if amplifiers $Q_L$, $Q'_L$ as shown in FIGS. 4 through 7 are employed, these additions are not required. In the case where the above described additions are necessary, since the $I_vR$ is a constant value, it is necessary merely to add $I_vR$ to the power source voltage $E$ and also to each of the reference potential $V_{rh}$, and these additions have no relation to the logic operation of the circuit device. The same consideration can also be applied to $I_L$ and $I'_L$ in FIG. 8.

Figures 3, 4:
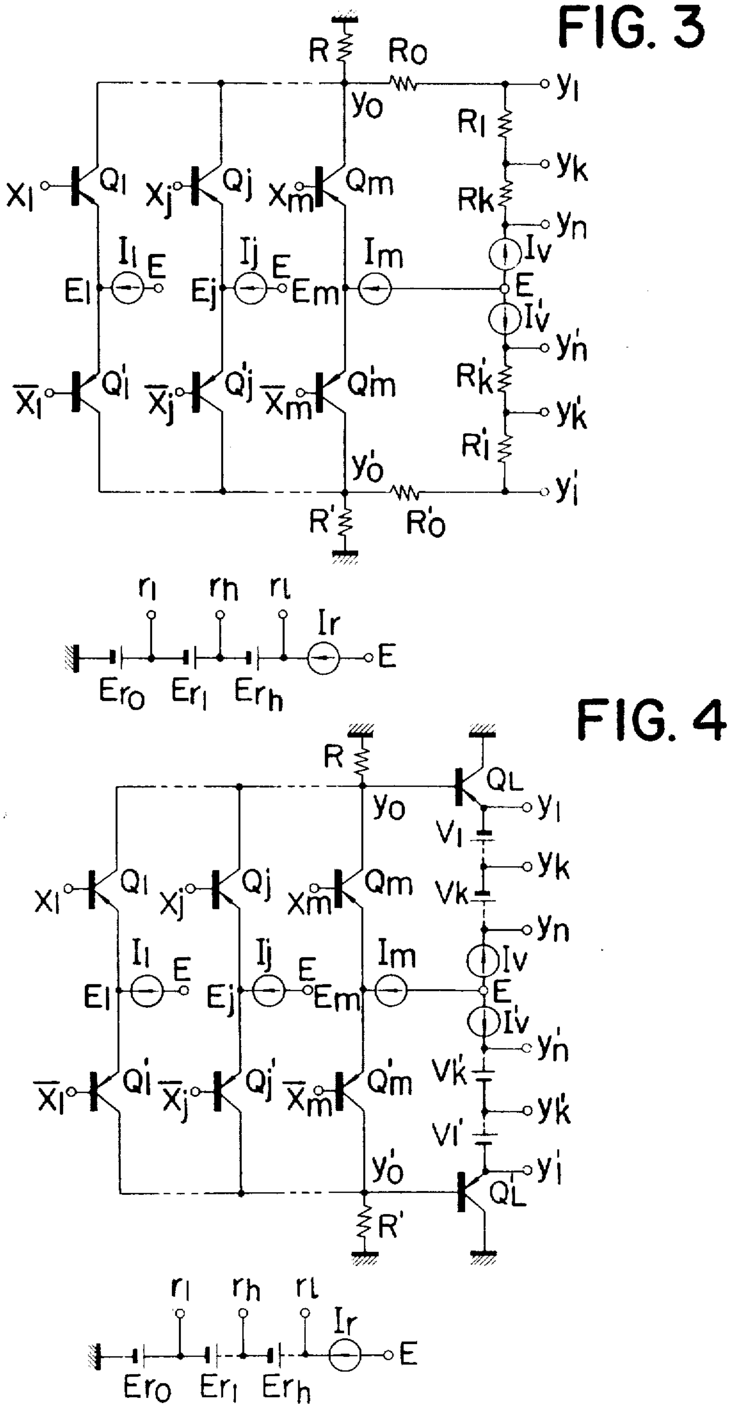

FIG. 3 illustrates a case where resistors are employed for the constant voltage sources from $v_o$ to $V_{n-1}$ and from $V'_o$ to $V'_{n-1}$.

FIG. 4 illustrates a case where amplifiers are inserted between the points $y_o$ and $y_l$ and also between the points $y'_o$ and $y'_l$, respectively, and the influence of the external load is thereby minimized and the output impedances of the circuit are also reduced. In the illustrated example, an emitter follower is employed for each of the amplifiers.

Figure 5:
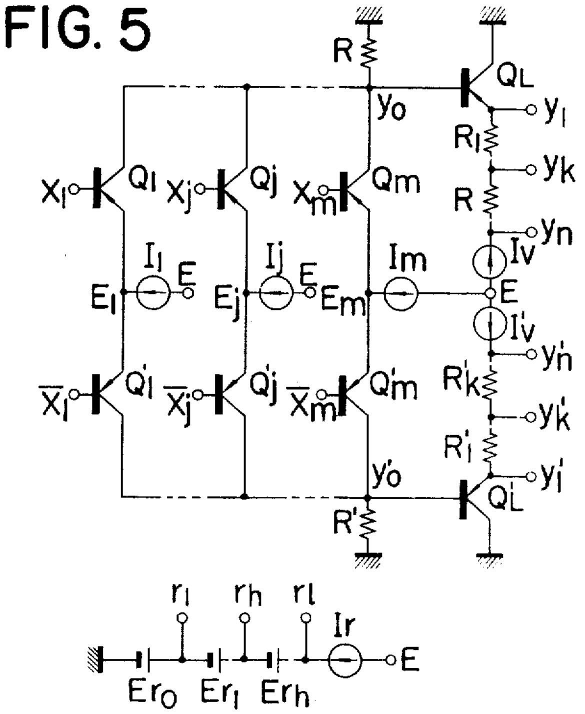
Figure 6:
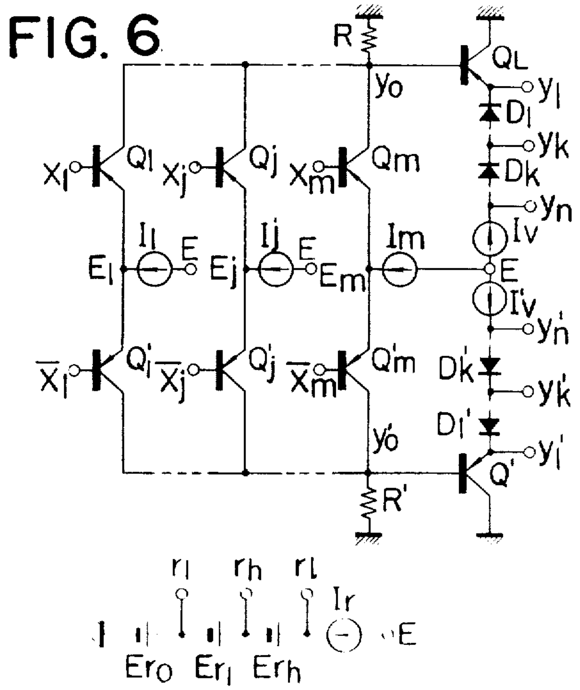

Furthermore, for the realization of the constant voltage sources from $v_l$ to $v_{n-1}$ and from $V'_l$ to $V'_{n-1}$ in FiG. 4, various methods may be considered. FIGS. 5 and 6 show the cases where resistors and diodes are employed respectively for these constant voltage sources. In addition, the employment of zenner diodes may also be considered for these constant voltage sources, and whichever of the above described methods is employed is a mere design matter.

Figures 7, 8:
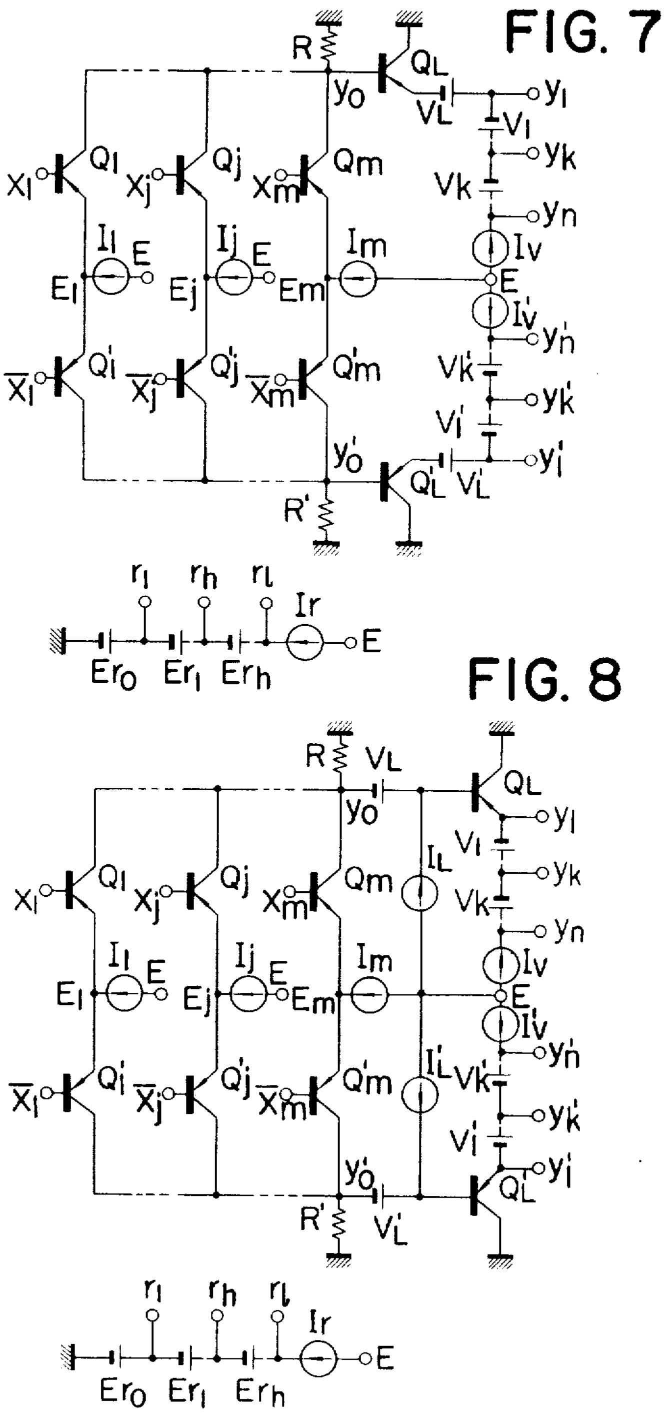
Figure 9:
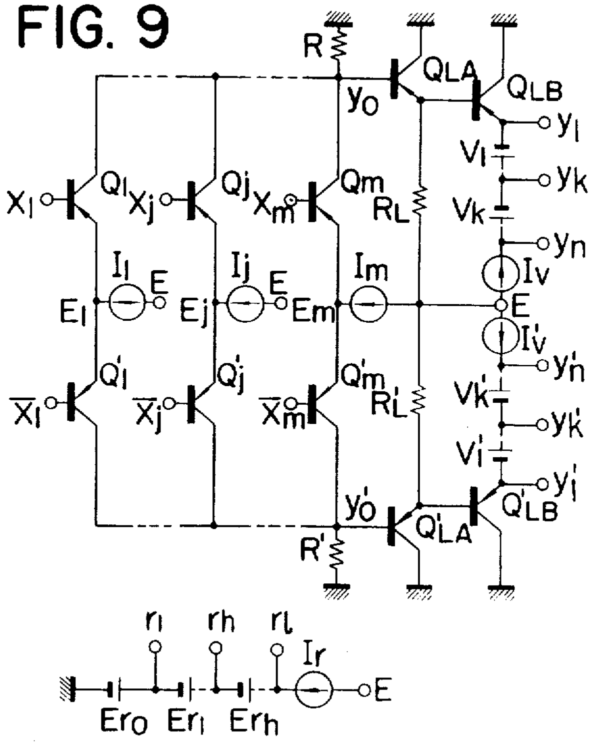

Although FIG. 4 illustrates the case where the constant voltage source $V_o$ is realized merely by the forward voltage drop $V_F$ across the emitter and the base of a transistor $Q_L$, another disposition as illustrated in FIG. 7 may also be employed when the value of $V_F$ is not sufficient for the realization of $V_o$. In the case of FIG. 7, $V_o = V_F + V_L$ and in arranged positions of $V_F$ and $V_L$ may be mutually reversed, and when the positions thereof are reversed, $V_L$ passes merely the base current of the transistor $Q_L$. For this reason, if it is desired, a constant current source $I_L$ may be employed in addition to $V_L$, and such an example is shown in FIG. 8. The example shown in FIG. 9 may be considered as a modification of either of the examples shown in FIG. 7 and FIG. 8, and the constant voltage source $V_o$ is realized by two stages of emitter followers.

Figure 10:
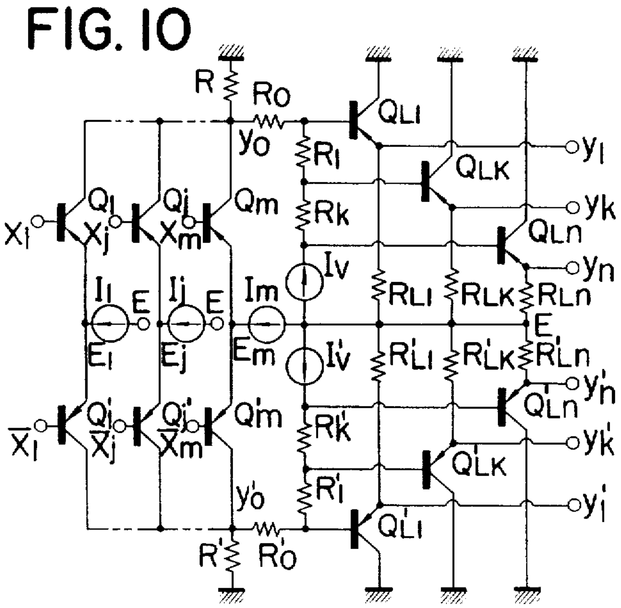

Because the fanouts of $y_l$ and $y'_l$ are usually larger than those for $y_k$ and $y'_k$ ($k \geq 2$), provision of an amplifier only for $y_l$ and $y'_l$ is frequently advantageous. Conversely, when $y_k$ and $y'_k$ ($k \geqq 2$) are also heavily loaded, an amplifier may also be attached to each of the required $y_k$ and $y'_k$, and such an example is indicated in FIG. 10.

Figure 11:
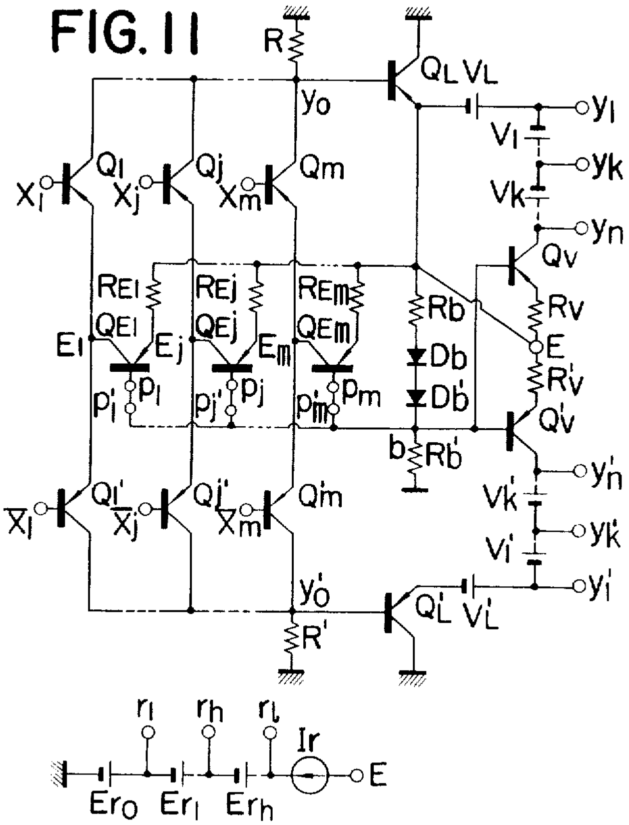

Various ways of realizing the constant voltage sources have been described in the above examples, and the methods for realizing the constant current sources will now be described below. $Q_{E_j}$ and $R_{E_j}$ in FIG. 11 are the devices for realizing the constant current sources $I_f$ in FIGS. 1 through 10 and 13. Similarly, $Q_v$ and $R_v$, and $Q'_v$ and $R'_v$ realize $I_v$ and $I'_v$ in FIGS. 2 through 10, and 13. Here, a voltage divider composed of resistors $R_b$, $R'_b$ and diodes $D_b$, $D'_b$ are employed for imparting suitable base potentials to transistors, and in the voltage divider, diodes $D_b$ and $D'_b$ are provided for compensating the variations in the transistor characteristics due to the temperature and for maintaining the currents at constant values. Therefore, if these features are not required, the diodes may be omitted.

Point $P_j$ and $P'_j$ in FIG. 11 are employed for an explanation of a somewhat different usage of the present circuit. When an intermediate point between $P_j$ and $P'_j$ is broken and a suitable signal is applied to $P_j$, it is apparent that the value of $I_j$ can be changed over between 0 and $I$ by the application of the signal. Accordingly, within the constant sources of from $i_l$ to $I_m$, if only some of the constant current source $I_j$ are kept to $I$ and all of the others are reduced to 0, it will be apparent that the output of this circuit will be a linear sum of $x_j$, corresponding to $I_j$ kept to $I$, within the inputs $x_l$ through $x_m$, or the value obtained by adding thereto or subtracting therefrom a constant value.

As a special case of this example, if only a source $I_{j_0}$ within the constant current sources $I_l$ through $I_m$ is left operative, and all of the others are reduced to 0, then, the output voltage corresponding to $x_{j_0}$ can be obtained. In other words, it is possible to obtain a switching circuit which can pick up an input $x_{j_0}$ from the m inputs consisting of $x_l$ through $x_m$, in accordance with signals applied to $P_l$ through $P_m$.

Furthermore, it is also possible to render the value of $I_f$ into a variable in a wider range of values without limiting it merely to 0 and $I$ as in the case of the above description, and this variation can be achieved by varying the values of $V_{p_i}$ by means of electric signals. It is also possible to provide $Q'_{E_j}$ for $Q_{E_j}$, emitter voltage $E'_j$ of these transistors being commonly connected, to thereby constitute a current switch is constructed. In this manner, the weight of $x_j$ in the case of the described linear addition can be made variable.

Figure 12:
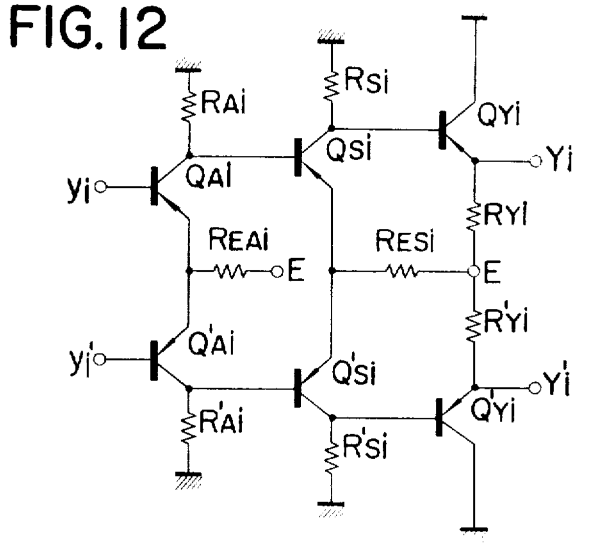

FIG. 12 illustrates an example of a voltage amplifier which is employed when Equations (32) and (33) are not satisfied, that is, when the amplitude of the output voltage thereof is not sufficiently large for driving the current switches at the succeeding stage. In the drawing, a transistor pair $Q_{A_i}$ and $Q'_{A_i}$ constitute differential amplifiers, and these transistors drive current switches consisting of transistors $Q_{S_i}$ and $Q'_{S_i}$. Transistors $Q_{Y_i}$ and $Q'_{Y_i}$ function as amplifiers and also as level shifters as in the case of the transistors $Q_L$ and $Q'_L$ in FIGS. 4 through 11.

Here, transistors $Q_{S_i}$, $Q'_{S_i}$, and $Q_{Y_i}$, $Q'_{Y_i}$ are provided with a sufficient output amplitude and adequate output internal impedances. However, when the influence of noises due to the wirings can be neglected as in the case of the interior of a pellet of a large-scale integrated-circuit, these transistors may be omitted, and the collectors of the transistors $Q_{A_i}$ and $Q'_{A_i}$ may be directly connected to the inputs of the pair of current switches provided in the succeeding stage of the circuit according to the present invention.

Although various examples of realizing the constant voltage sources $V_o$ through $V_{n-1}$ and a constant current source $I_v$ have been described, the functions of $E_{r_0}$ through $E_{r_{l-1}}$ and $I_r$ are also equivalent to those described in the above description, and the only difference is that, in contrast to the terminal voltage of the above described examples which is varied in accordance with the applied signals, the terminal voltage in the latter case is maintained at a constant value, and for this reason, the latter case can be realized in a similar or simpler manner than the former case.

Since the $I_j$ is the most important in this logic circuit, a quantitative consideration will be given in relation to the value of the power source voltage which is employed in the circuit according to the present invention.

As is apparent from FIG. 2, the power source voltage E is determined from $V_{r_1}$, $V_{y_n}$, and an emitter voltage $V_{E_j}$. Here, $V_{r_1}$ is a constant value, and, when $V_{r_1}$ is obtained from a voltage divider circuit interconnected between the power source voltage $E$ and the ground, of course, there is a relation of $$E \geqq V_{r_1} \tag{36}$$

Moreover, when $V_{y_n}$ and $V_{E_j}$ vary, and $I_v$ and $I_j$ are realized by resistors, the variation factor of these constant current sources are given by $$\frac{I_{v_{max}} - I_{v_{min}}}{I_{v_{min}}} = \frac{V_{y_n max} - V_{y_n min}}{E - V_{y_n max}} \tag{37}$$

$$\frac{I_{j_{max}} - I_{j_{min}}}{I_{j_{min}}} = \frac{V_{E_{jmax}} - V_{E_{jmin}}}{E - V_{E_{jmax}}} \tag{38}$$

and from the constancy of the current required for $I_v$ and $I_j$, the lower limit of E can be determined from these equations. If the lower limit of E thus determined from Equations (36) through (38) is practically too large, such procedures as constituted as in FIG. 11 wherein $Q_v$ and $R_v$, $Q_{E_j}$ and $R_{E_j}$ are employed, and a voltage clipping will be required. More detailed descriptions for such cases will be set forth hereinafter in the paragraphs wherein the clipping and examples of such designs are described. As described above, the lower limit of $E$ is determined ultimately by $V_{r_1}$, $V_{y_n}$ max, $V_{y_n}$ min, $V_{E_j}$ max, and $V_{E_j}$ min, and the values thus determined for the cases of the above described (i) through (v) are as follows:

$$V_{r_1} = \begin{cases} \frac{m-1}{2}V + V_o, \text{ in the case of (iii)} \\ \frac{m}{2}V + V_o, \text{ in the case of (iv)} \\ \left(m - \frac{1}{2}\right) + V_o, \text{ in the case of (v)} \end{cases} \tag{39}$$

$$V_{y_{nmin}} = \begin{cases} (m-1)V + V_o \text{ in the cases of (i) (ii)} \\ V_o \text{ in the cases of (iii) (iv) and (v)} \end{cases} \tag{40}$$

$$V_{y_{nmax}} = \begin{cases} (2m-1)V + V_o \text{ n the cases of (i) (ii)} \\ mV + V_o \text{ in the cases of (iii) (iv) (v).} \end{cases} \tag{41}$$

$$V_{E_{jmin}} = V_o + V_F \tag{42}$$

$$V_{E_{jmax}} \begin{cases} (m-1)\ V + V_o + V_F \text{ in the cases of (i) (ii)} \\ \frac{m-1}{2}V + V_o + V_F \text{ in the case of (iii)} \\ \frac{m}{2}V + V_o + V_F \text{ in the case of (iv)} \\ \left(m - \frac{1}{2}\right)V + V_o + V_F \text{ in the case of (v)} \end{cases} \tag{43}$$

The cases wherein voltage clipping is employed will now be described in detail. The voltage clipping procedure may be employed for reducing the width of variation range of $V_{y_n}$, the magnitude of $V_o$, and the like. For instance, in the example of the above described case (iii), $V_{r_1}$ of Equation (39) is obviously the maximum value of the reference potential $V_{r_h}$. Since the output potential $V_{y_1}$ is to be compared with this potential, the transistor in the succeeding stage, as in FIG. 1, to which is applied the potential $V_{y_1}$ is positively brought into an interrupted state when the value of $V_{y_1}$ is higher than a voltage which is obtained by adding $V_{min}$ to the value of Equation (39). Because $n = 1$, the maximum value of $V_{y_1}$, namely $V_{y_n}$max, will be given by Eq. (41). However, it is not necessary to employ such an extreme value, and the next high value which is symbolized by $\underline{V}_{y_1}$ max and defined as $$V_{y_1}\text{max} \equiv V_{r_1} + V_{min} \tag{44}$$

is sufficient for this purpose. On the contrary, the fact that decreasing of the value of $V_{y_1}$, is disadvantageous for the operation of the circuit until $V_{y_1}$ becomes $V_{y_1}$ max will be apparent from the definition of $V_{min}$. For these reasons, it will be advantageous that a PN junction, for instance, be connected between the point $y_o$ and a suitable potential source and one side of the junction is connected to the point $y_o$, so that the current passing through the junction in the case of $V_{y_o} = V_{y_1}$ max $- V_o$ may be made negligible and that the forward current passing through the junction, in the case $V_{y_0}$ becomes larger than this value, is made steeply increasing.

Figures 13, 14:
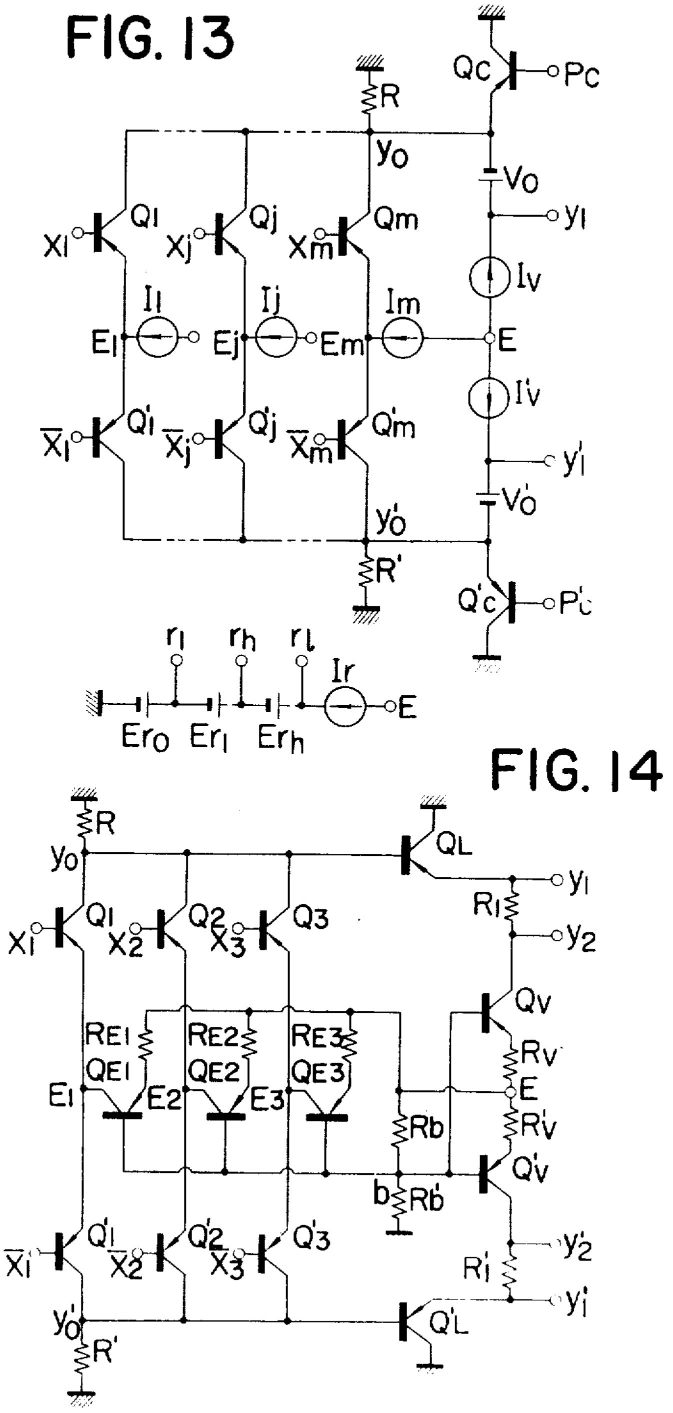

FIG. 13 shows such a case. The emitter-base junction in the transistor $Q_c$ corresponds to the above described PN junction. A constant voltage $V_{p_0}$ which is to be connected to the base $P_c$ of the transistor $Q_c$ can be obtained, for instance, from a suitable tap of a voltage dividing circuit for obtaining a voltage $V_{r_h}$ as shown in FIG. 13.

Here, it is assumed that the voltage difference of $V_{y_0}$ which is required for causing the PN junction to be shifted from its cut-off state to the full conduction state is $V'_{min}$. Although the thus assumed voltage difference $V'_{min}$ is similar to the above described $V_{min}$, the value is ordinarily $$V'_{min} \leqq V_{min} \tag{45}$$

because the noise-effect caused from the interconnecting wirings in this case is far less than those in the other.

When it is so assumed, it will be apparent that $$V_{y_1} \leqq \tilde{V}_{y_1 max} \equiv \underline{V}_{y_1 max} + V'_{min} \tag{46}$$

is maintained, and, since there is a relation $V_{y_0} \leqq \tilde{V}_{y_1 max} - V_o$, if this relation is employed in Equation (34) and if it is assumed, as is described above, that $V_{r_1}$ is equal to $V_o$, the following equation is obtained for replacing Equation (35).

$$\frac{m-1}{2}V + V_{min} + V'_{min} - V_0 \leqq V'_F$$

This may be rewritten as $$V_0 \geqq \frac{m-1}{2}V + V_{min} + V'_{min} - V'_F \tag{47}$$

and when Equations (33), (45) are employed, $$V_0 \geqq \frac{m+1}{2}V - V'_F \tag{48}$$

is obtained for a sufficient value. $V'_o$ can be obtained in a similar manner. Since $m \geqq 2$, it will be apparent that the value of $V_o$ has been considerably decreased when Equation (48) is compared with Eq. (35). For instance, when it is assumed that $m = 4$, $V_{min} = 0.45\ V$, $V'_{min} =$ $0.3V$, $V'_F = 0.3V$, and $V = 0.9\ V$, the value of $V_o$ becomes $V_o \geqq 1.95\ V$ from Eq. (47).

When the maximum probable value of $V_{x_j}$ is assumed to be $V_{x_j\,max}$, the forward voltage between the emitter and base of the transistor $Q_j$ is assumed to be $V_F$, and also the minimum value of the terminal voltage, which is required for providing a desired constant current characteristic of $I_j$, is assumed to be $V_{I_j}$ min, then it will be apparent that $$E \geqq V_{x_j\,max} + V_F + V_{I_j\,min} \qquad (49)$$

Here, if the circuits according to the present invention are connected in series, a relation $$V_{x_j\,max} \quad 2mV - V'_F \qquad (50)$$

will be obtained for the cases of FIGS. 1 through 11 by substituting Eq. (35) instead of $V_o$ in the right-hand side of Eq. (41), and in the case of FIG. 13, $$V_{x\,max} \geqq (m-1)V + 2V_{min} + 2V'_{min} - V'_F$$
$$\geqq (m+1)V - V'_F \qquad (51)$$

will be obtained by substituting the right-hand side of Equation (44) for the $V_{y_1max}$ in the right-hand side of Equation (46), and by further substituting the right-hand side of Equation (47) for $V_o$ in the equation thus obtained.

For instance, in the previously indicated numerical example, the right-hand side of Equation (50) is 6.9 $V$, and the intermediate term of Equation (51) is 39 V. From this result, it is apparent that the power source voltage can be reduced by $6.9 - 3.9 = 3.0\ V$ when the circuit in FIG. 1 is changed to the circuit of FIG. 11 by employing a voltage clipping circuit.

A numerical example of the logic circuit according to the present invention will be described with reference to FIG. 14 wherein a push-pull signal is employed and m is selected to be 3 as in the case of (i).

When it is assumed that $V_{min} = 0.35$ volts, $V$ is also 0.35 volts in accordance with Eq. (32), and when it is further assumed that $V'_F = 0.35$ volts and $V_o = 0.7$ volts from Eq. (35), and also $V_F = 0.7$ volts, then an advantageous relation of $V_o = V_F$ is obtained.

Furthermore, from Eq. (10)

$$V_{y_2} - V_{y_1} = V'_{y_2} - V'_{y_1} = 0.7\ V \qquad (52)$$

from Eqs. (8), (9), (11) and (12)

$$\left.\begin{array}{l} V_{y_0} = 0.35S \text{ volts} \\ V_{y_1} = 0.7 + 0.35S \text{ volts} \\ V_{y_2} = 1.4 + 0.35S \text{ volts} \\ V'_{y_0} = 1.05 - 0.35S \text{ volts} \\ V'_{y_1} = 1.75 - 0.35S \text{ volts} \\ V'_{y_2} = 2.45 - 0.35S \text{ volts} \end{array}\right\} \qquad (53)$$

From these values, it is apparent that $$\left.\begin{array}{l} V_{y_2\,min} = 1.4 \text{ volts} \\ V_{y_2\,max} = 2.45 \text{ volts} \\ V_{E_j\,min} = 1.4 \text{ volts} \\ V_{E_j\,max} = 2.1 \text{ volts} \end{array}\right\} \qquad (54)$$

These results apparently coincide with those indicated by the Eqs. (40) through (43).

Since the maximum value in Eq. (54) is $V_{y_2max} = 2.45$ volts, it is also apparent that the transistors $Q_v$ and $Q'_v$ which are brought nearest to the saturated condition among the transistors $Q_{E_1}$ through $Q_{E_3}$, $Q_v$, $Q'_v$. At this point, if the maximum forward bias allowed for the collector of these transistors is assumed to be $V'_F = 0.35$ volts, a relation of $V_b \geqq V_{y_2max} - V'_4 = 2.1$ volts will be obtained.

Accordingly, the emitter potentials for the transistors $Q_{E_1}$ through $Q_{E_3}$, $Q_v$, and $Q'_v$ must be not less than 2.8 volts since the above described value of $V_b$ is further added by the voltage $V_F$.

Here, if variation up to 4 percent is allowed for each of the constant current sources $I_1$ through $I_3$, $I_v$, and $I'_v$ in the case where the $V_F$ applied to the transistors is varied with a deviation of 40 millivolts, a relation $V_{R_{E_j}} = V_{R_v} = V'_{R_v}$ and $V_{R_{E_j}} \geqq 1$ volt is obtained, and a power source voltage of $E \geqq 3.8$ volts is determined to be suitable.

Therefore, considering the fact that many of the ordinary logic circuits employ a power source voltage of 5 volts, the power source voltage $E$ herein employed will also be determined at 5 volts.

In this case, assuming that $V_{R_{E_j}} = 21$ volts, the variations in the constant current sources $I_1$ through $I_3$, $I_v$, and $I'_v$ will be about 1.9 percent. Furthermore, $V_b = E - V_{R_{E_j}} - V_F = 2.2$ volts, and the maximum forward bias applied to the collectors of the transistors $Q_v$ and $Q'_v$ will be $V_{y_2max} - V_b = 0.25$ volts, and the maximum forward bias applied to the collectors of the transistors $Q_{E_1}$ and $Q_{E_3}$ will be $V_{E_j\,max} - V_b = -0.1$ volt. That is, the collectors of the transistors $Q_{E_1}$ through $Q_{E_3}$ are always reversely biased by a voltage of more than 0.1 volt. When the constant $h_{FE}$ for each of these transistors is sufficiently large, $$I_j = \frac{V}{R} = \frac{V_{R_{E_j}}}{R_{E_j}}$$

hence $$\frac{R_{E_j}}{R} = \frac{V_{R_{E_j}}}{V} = \frac{2.1}{0.35} = 6$$

Likewise, $$I_v = \frac{V_1}{R_1} = \frac{V_{R_v}}{R_v}$$

and as a result, $$\frac{R_v}{R_1} = \frac{V_{R_v}}{V_1} = \frac{2.1}{0.7} = 3$$

and $$\frac{R_b}{R'_b} = \frac{E - V_b}{V_b} = \frac{2.8}{2.2} = 1.27$$

When $I_j$, $I_v$, $I'_v$, and $I_{R_b}$ are determined, with consideration of the power consumption, speed, stability, etc., all of the constants for the circuit can be determined from these equations. For instance when $I_j = 3.5$ milliamperes, $I_v = I'_v = 5$ milliamperes, and $I_{R_b} = 4.0$ milliamperes, $R = R' = 100$ ohms
$R_{E_1} = R_{E_2} = R_{E_3} = 600$ ohms
$R_1 = R'_1 = 140$ ohms
$R_v = R'_v = 420$ ohms
$R_b = 700$ ohms, and
$R'_b = 550$ ohms At this time, the total sum of currents will be 24.5 milliamperes, and the power consumption will be 123 milliwatts.

Representing the total sum of the base currents of the transistor $Q_{E_1}$ through $Q_{E_3}$, $Q_v$, and $Q'_v$ by the form of $\Sigma I_B$, it may be written that $I'_{R_b} = I_{R_b} + \Sigma I_B$. $I_{R_b}$ should be determined sufficiently larger than $\Sigma I_B$ in consideration of manufacturing errors of the circuit elements, variation of $h_{FE}$ due to the temperature, variation of $\Sigma I_B$ depending on the employed signals and so forth. However, when the power consumption is considered, a smaller value of $I_{R_b}$ will be better. For this reason, the value of the $I_{R_b}$ is selected at a compromized value, considering all of the above mentioned factors.

In FIG. 14, assuming that $h_{FE}$ is sufficiently large, the resistance $R'_b$ has been selected to 550 ohms. However, in the actual application, the value of $R'_b$ might be selected to 523 ohms when $h_{FE}$ is assumed to be 100, and such a correction will be employed in various cases, for instance, in a relation between the value of $h_{FE}$ of the transistor $Q_L$ and the resistor $R$. Hereinafter such a correction of circuit parameters is omitted since it is only one of a large number of small matters of practice.

As described before, the circuit according to the present invention is quite different from other conventional logic circuits in respect of the multi-output and the multiplex features. However, it is also a conspicuous feature of the invention that the circuit thereof can be easily combined with conventional logic circuits, and there is no difficulty in obtaining a conversion circuit to be interposed therebetween.

Figure 15:
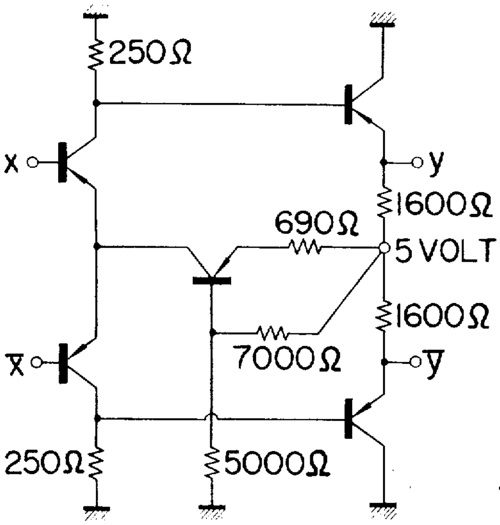
FIGS. 15, 16, 19, and 20 are schematic connection diagrams of examples of conversion circuits to be employed between a logic circuit according to the present invention and other types of logic circuit.
Figure 16:
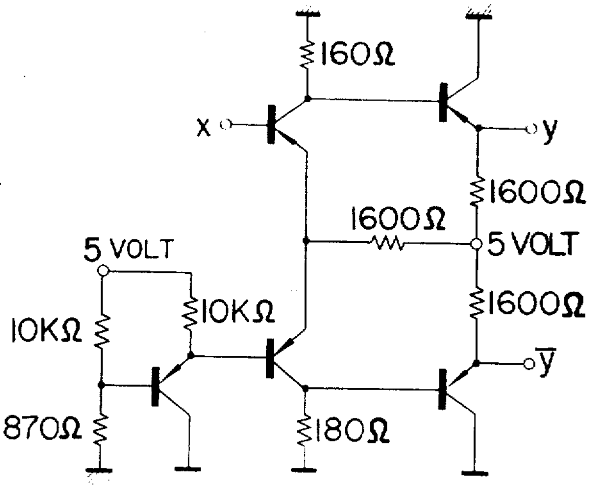
Figure 17:
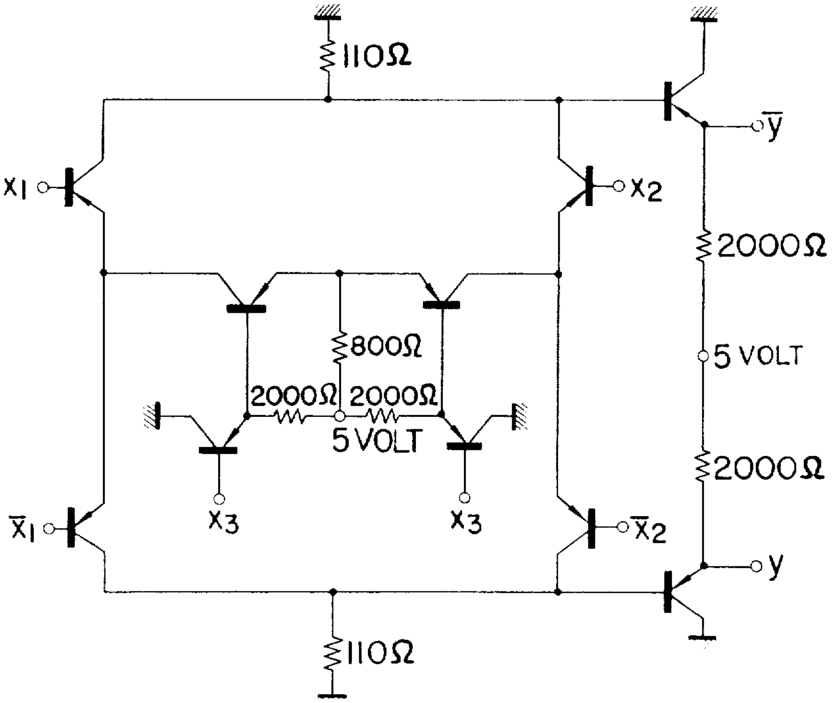
FIG. 17 is a circuit diagram showing a switching circuit which can be employed with the logic circuits according to the present invention.
Figure 28:
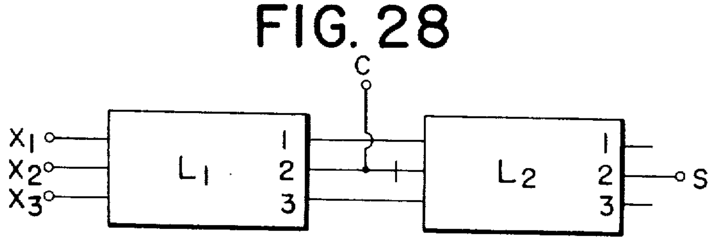
FIGS. 28 through 31 are diagrams showing full-adders employing logic circuits according to the invention.

Although it is impossible to indicate all of the conversion circuits, some typical examples thereof, for instance, those for CML and TTL are indicated in FIGS. 15, 16, 19, and 20, and still another example is shown in FIG. 17. Of these, the circuit of FIG. 15 is employed for coupling the output of the circuit of FIG. 14 to the input of a CML circuit, and the circuit of FIG. 16 is employed for coupling the output of a CML circuit to the input of the circuit of FIG. 14. FIG. 17 is another example of a circuit which is employed in the case where two sets of full-adders, each as illustrated in FIG. 28 and comprising two circuits as shown in FIG. 14, are provided and these two sets are switched to make a high-speed carry adder. In FIG. 17, $$y = x_1 x_3 \vee x_2 \bar{x}_3$$

herein the symbol $\vee$ indicates a logic sum.

Figure 18:
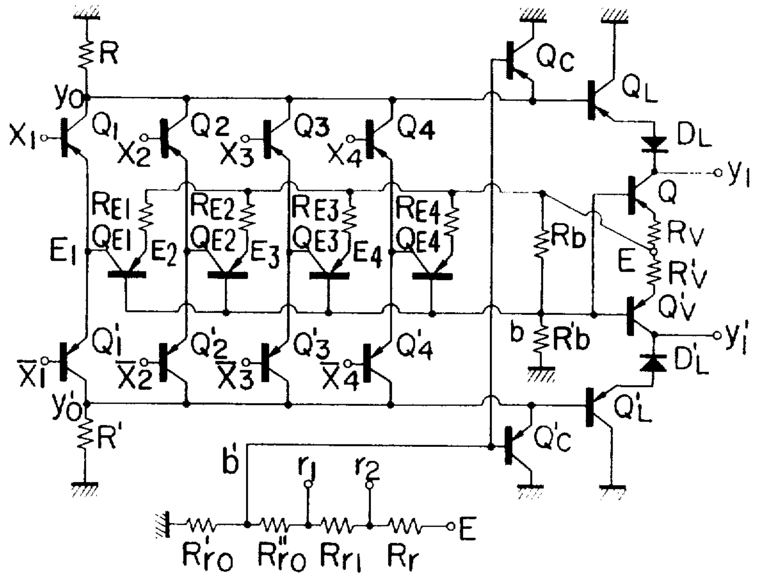

FIG. 18 shows an example of design for the case of (iii) wherein a single ended signal is employed and $m = 4$. The manner in which the constants are determined is fundamentally similar to that shown with respect to FIG. 14. However, the principal differences in this case are that voltage clipping is carried out by means of transistors $Q_c$ and $Q'_c$, that the base potentials of these transistors are obtained from tapped voltages which are produced by dividing the resistor $R_{r_o}$, and that zener diodes $D_L$, $D'_L$ are employed because of the voltage relationship $V_0 > V_F$. Example values of the constants are as follows.

| | |
|---|---|
| $V_{min} = 0.45$ volts | $V'_{min} = 0.35$ volts |
| $V = 0.9$ volts | $V_{D_L} = 1.2$ volts |
| $V_F = 0.7$ volts | $V'_F$ 0.35 volts |
| $V_{R_{E_j}} = 0.6$ volts | $E = 5.0$ volts |
| $V_b = 1.7$ volts | $V'_b = 1.45$ volts |
| $V_{r_1} = 2.15$ volts | $V_{r_2} = 3.25$ volts |
| $V_{y_1,min} = 1.9$ volts | $V_{y_1,max} = 4.05$ volts |
| $V_{E_j,min} = 2.6$ volts | $V_{E_j,max} = 3.95$ volts |
| $R = R' = 300$ ohms | $R_{r_1} = 200$ ohms |
| $R_r = R'_r = 150$ ohms. | $R_b = 320$ ohms. |
| | $R'_b$ 910 ohms |
| $R'_{r_o} = 290$ ohms | $R'_{r_o} = 180$ ohms |
| $R_{r_l} = 180$ ohms | $R_{r_l} = 350$ ohms |

In this case, total sum of the current is 29 milliamperes, and the power consumption is 145 milliwatts.

Figure 19:
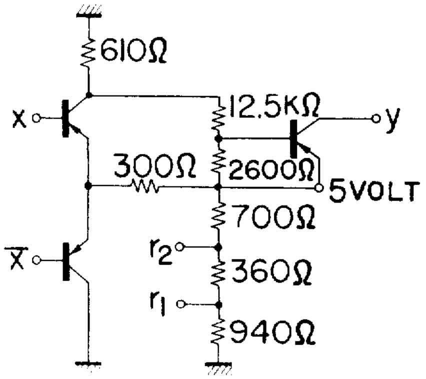
Figure 20:
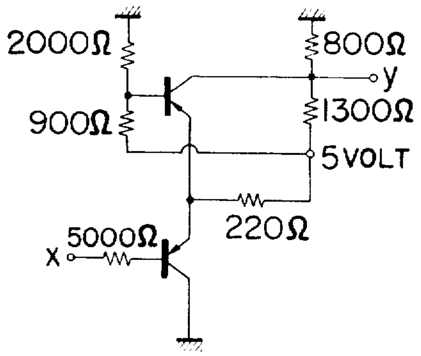

FIGS. 19 and 20 illustrate the circuits which are employed when the circuits according to the present invention are commonly employed together with TTL circuits. More particularly, the circuit shown in FIG. 19 is a conversion circuit to be employed when it is desired to supply the output of the circuit shown in FIG. 18 to the input of the TTL, and the circuit shown in FIG. 20 is a conversion circuit which is employed when the output of the TTL is supplied to the input of the circuit of FIG. 18.

Figure 21:
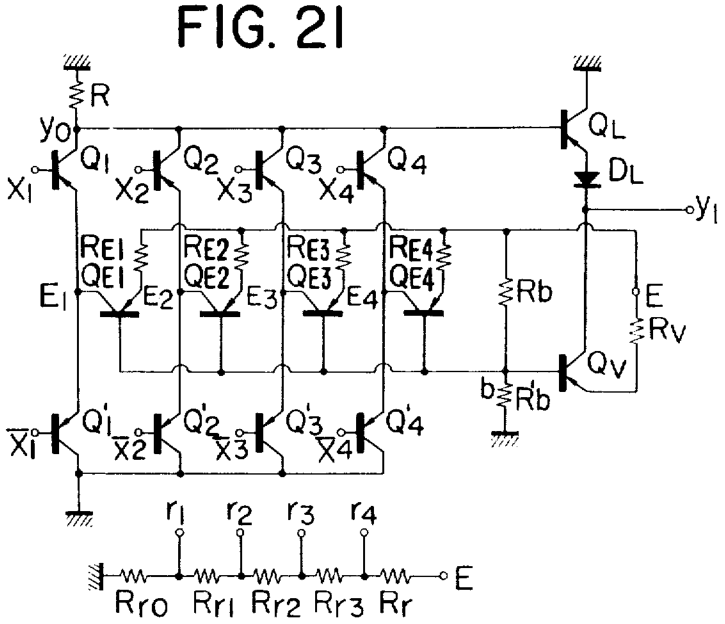

FIG. 21 shows an example design of the case (v) wherein a single ended signal is employed and $m = 4$. The method of determining the constants is fundamentally similar to those shown with respect to FIGS. 14 and 18, and example values thereof are as follows.

| | |
|---|---|
| $V_{min} = 0.5$ volt | $V = 1.0$ volt |
| $V_F = 0.7$ volt | $V'_F$ 0 volt |
| $V_{D_L} = 3.3$ volts | $V_{R_{E_j}} = 1.0$ volt |
| $E = 10.0$ volts | $V_b = 8.3$ volts |
| $V_{r_1} = 4.5$ volts | $V_{r_2} = 5.5$ volts |
| $V_{r_3} = 6.5$ volts | $V_r = 7.5$ volts |
| $V_{y_1,min} = 4.0$ volts | $V_{y_1,max} = 8.0$ volts |
| $V_{E_j,min} = 4.7$ volts | $V_{E_j,max} = 8.2$ volts |
| $R = R' = R_{E_f} = 600$ ohms | |
| $R_c = 200$ ohms, $R_b = 800$ ohms, $R'_b = 3,900$ ohms | |
| $R_{r_1} = R_{r_2} = R_{r_3} = 400$ ohms | |
| $R_{r_0} = 1,800$ ohms | $R_r = 1,000$ ohms |

In this case, the total sum of the current is 16.3 milliamperes and the power consumption is 163 milliwatts.

The temperature compensation of the circuit according to the present invention will now be described.

In the circuits shown in FIGS. 18 and 21, for instance, the following relations are obtained.

$$V_{y_1} = V_{y_0} + V_F + V_{D_L}$$

$$V_{y_0} = SV$$

$$V = IR$$

$$I = (E - V_F - V_b)/R_{E_j}$$

From these relations, the following equation is obtained.

$$V_{y_1} = (SR/R_{E_j})(E - V_F - V_b) + V_F + V_{D_L} \quad (55)$$

By differentiating this equation with respect to temperature $T$ and employing the relation $R/R_{E_j} = V/V_P$, the following equation is obtained $$\frac{dV_{y1}}{dT} = \frac{SV}{V_{R_{E_j}}}\left(\frac{dE}{dT} - \frac{dV_F}{dT} - \frac{dV_b}{dT}\right) + \frac{dV_F}{dT} + \frac{dVD_L}{dT} \quad (56)$$

For the temperature compensation, the absolute value of this equation should be made minimum. For instance, when $$dE/dT = dV_b/dT = 0 \quad (57)$$

the following equation is obtained.

$$\frac{dV_{y1}}{dT} = \left(1 - \frac{SV}{V_{R_{E_j}}}\right)\frac{dV_F}{dT} + \frac{dVD_L}{dT} \quad (58)$$

Here, the value of $S$ may be considered to be from 0 to 2 and from 0 to 4 in the cases of FIG. 18 and FIG. 21, respectively. Accordingly, $V/V_{R_{E_j}}$ is so selected that Eq. (58) becomes 0 at $S = 1$ in FIG. 18 and $S = 2$ in FIG. 21.

In the case of FIG. 18, when it is assumed that $$\frac{dV_F}{dT} / \frac{dV_{D_L}}{dT} = 2$$

then $V/V_{R_{E_j}}$ will be 1.5, and in the case of FIG. 21, when it is assumed that $$\frac{dV_F}{dT} / \frac{dV_{D_L}}{dT} = 1, \frac{V}{V_{R_{E_j}}} \text{ will be 1.}$$

All of the constants described above with reference to FIGS. 18 and 21 have been determined in this manner. According to this method, the value of $V_{R_{E_j}}$ becomes a comparatively small value. Hence the variation of $I$ due to the manufacturing error of $V_F$ becomes larger. When this error is also taken into consideration, the optimum value of $V_{R_{E_j}}$ will become a larger value than that in the above description. That is, the optimum value of $V_{R_{E_j}}$ can be determined if the manufacturing error of $V_F$ is known.

According to the above described method, the value of $dV_{y^1}/dT$ can be brought to 0 only for a certain value of $S$.

Figure 22:
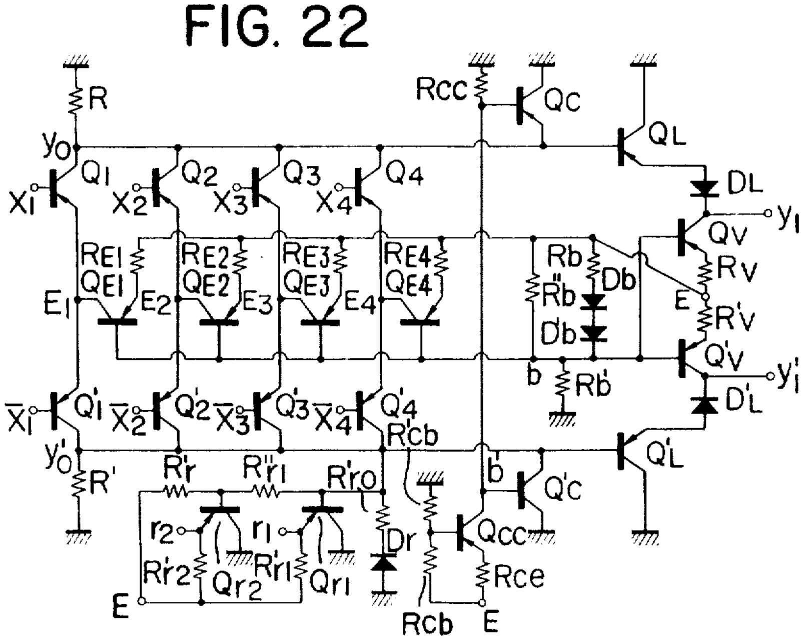

Otherwise, the circuit of FIG. 18 may be altered so that $dV_{y^1}/dT$ is maintained at 0 for substantially the total range of $S$, and, at the same time, the internal impedances of the reference potential sources are made sufficiently low. Such a circuit is indicated in FIG. 22. In the circuit of FIG. 22, reference characters $D_b$ and $D'_b$ designate diodes, the forward voltage drop thereacross being made substantially equal to the emitter-base voltage drop of the transistor $Q_{E_j}$ even if the manufacturing errors and temperature variations thereof are taken into consideration. By so doing, the current $I_j$ is maintained at a constant value. Likewise, the resistors $R_{cc}$, $R_{ce}$, $R_{cb}$, and $R'_{cb}$ and the transistor $Q_{cc}$ are employed for compensating for the manufacturing errors of the emitter-base voltage drops and the base currents of the transistors $Q_c$ and $Q'_c$ and the variations thereof due to the temperature variation.

Furthermore, the voltage drops between the base and emitter of the transistors $Q_{r_1}$ and $Q_{r_2}$ and also the voltage drop of the zener diode $D_r$ are all varied in the same manner as those of the transistor $Q_L$ and the diode $D_L$, whereby temperature variating thereof are compensated for. Moreover, the transistors $Q_{r_1}$ and $Q_{r_2}$ make it possible to maintain the internal impedances of the reference voltage terminals $r_1$ and $r_2$ at lower values. Example values of the constants are as follows.

| | |
|---|---|
| $V_{min}$ = 0.45 volt | $V'_{min}$ = 0.35 volt |
| $V$ = 0.9 volt | $V_{D_L}$ = 1.45 volts |
| $E$ = 8.0 volts | $V_{D_r}$ = 1.4 volts |
| $V_r$ = 0.7 volt | $V'_r$ 0 volt |
| $V_{R_{E_j}}$ = 3.0 volts | $V_{R_b}$ = 2.3 volts |
| $V_b$ = 4.3 volts | $V'_b$ = 1.45 volts |
| $V_{r_1}$ = 2.6 volts | $V_{r_2}$ = 3.5 volts |
| $V_{y_j min}$ = 2.15 volts | $V_{y_j max}$ = 4.3 volts |
| $V_{E_j min}$ = 2.85 volts | $V_{E_j max}$ = 4.2 volts |
| $R = R'$ = 600 ohms | $R_{E_j}$ = 2,000 ohms |
| $R_r = R'_r$ = 1,200 ohms | $R_b$ = 1,500 ohms |
| $R'_b$ = 2,000 ohms | $R''_b$ = 6,000 ohms |
| $R'_{r_0}$ = 500 ohms | $R'_{r_1}$ = 900 ohms |
| $R''_{r_1}$ = 5,000 ohms | $R''_{r_2}$ = 4,000 ohms |
| $R'_r$ = 5,200 ohms | $R_{cc} = R_{ce}$ = 2,700 ohms |
| $R_{cb}$ = 3,700 volt | $R'_{cb}$ = 10 kiloohms |

In this case, the total sum of the current is 17.5 milliamperes, and the power consumption of the circuit is 140 milliwatts.

It is apparent that when a voltage drop in any of the elements is an intger multiple of a forward voltage drop of a diode, for instance, of about 0.7 volts, this voltage drop can be obtained by a series connection of several diodes instead of by a zener diode, whichever of these two is employed being a disign matter. The above described volues for $V_{D_L}$ and $V_{D_r}$ constitute an example of such choice.

Although the above described values of constants are employable in the ordinary temperature range, $V_{min}$ can be decreased in a lower temperature range, because the voltage coefficient $kT/q$ of a transistor decreases, and the same time, $V_F$ increases in the low temperature range. For these reasons, $V_o$ may be realized by only one stage of an emitter-follower, and realization of a circuit of higher quality is made possible in the low temperature range.

Versatility of the circuit according to the present invention due to the "multi-output" and "multiplexity" features thereof will now be explained.

Figure 23:
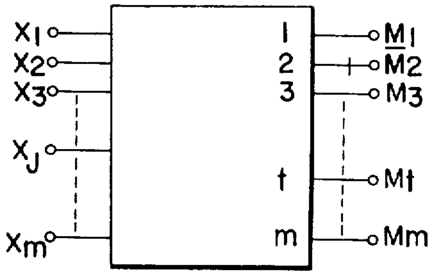
FIG. 23 is a symbolical representation of logic circuits according to the invention.

The logic circuit according to the present invention may be represented in the form of a block-diagram as shown in FIG. 23, which is considered to be a module. More particularly, the logic circuit is represented by a rectangle wherein $m$ input lines corresponding to $x_1$ through $x_m$ are described at the left side thereof. Since the logic circuit according to the present invention is symmetrical with respect to the inputs of equal weights, the requence of the correspondence may be arbitrarily determined for such inputs. Furthermore, the right-hand side of the rectangle is always described with $m$ output lines, so that these lines correspond to output functions $M_1$ through $M_m$. In this case, it should be noted that the $t$-th output line is always written for corresponding to the function $M_t$.

When necessary, the number $t$ is also written at the right-hand side interior of the rectangle. In addition, negations are indicated by short lines perpendicular to input lines or output lines, respectively. For instance, the second output line in FIG. 23 is an example of such notation. Furthermore, in view of the fact that a symmetrical logic function is a function of $S$ only, a simplified representation as follows will be employed.

$$f(s) = \{f(0), f(1), \ldots, f(m)\} \quad (59)$$

when there is no possibility of confusion, commas in the above representation may be further omitted. For instance, employing the symbol ⊕ for an exclusive.

Or, the following notation may be employed.

$$x_1 \oplus x_2 \oplus x_3 = \{0, 1, 0, 1\} = \{0101\}$$

$$M_t^m = \{\underbrace{0, 0, \ldots\ldots 0,}_{t} \underbrace{1, 1, \ldots\ldots 1}_{m-t+1}\}$$

Since there is a relation $$M_t^m(x_1, \ldots, x_m) = x_m M_{t-1}^{m-1}(x_1, \ldots, x_{m-1} V M_t^{m-1}(x_1, \ldots x_{m-1}) \quad (60)$$

a logic circuit according to the present invention having $m$ inputs may also be employed as a logic circuit having a number of inputs less than $m$.

Furthermore, it is also apparent that monotonic symmetrical functions may also be obtained by putting some of the variables equal to each other, that is, by degenerating the functions. For instance, in the case of $m = 7$ and $x_3 = x_4$, $x_5 = x_6 = x_7$, five sets of terminals of $x_3$ and $x_4$, $\bar{x}_3$ and $\bar{x}_4$ and $x_5$ through $x_7$ and $\bar{x}_5$ through $\bar{x}_7$ should be short-circuited, and the degenerated functions can be obtained. At this time the value of $I_3$ is multiplied twice, the value of $I_5$ is multiplied three times, and $Q_4$, $Q'_4$, $I_4$, $Q_6$, $Q'_6$, $I_6$, $Q_7$, $Q'_7$, and $I_7$ may be removed. Employing this method, the number of the input terminals and the number of the elements can be reduced.

The advantageous effect of the present invention which could not be realized by any of the conventional logic circuits will now be explained.

According to the recent progress in logic circuits, the complexity of the interconnecting wirings therebetween becomes an important problem, and along with the large-scale integrated circuits, the versatility of the basic module thereof is urgently demanded. The circuit according to the present invention can satisfy these demands to a great extent by the multi-output and the multiplexity features.

For instance, when two of the circuits according to the present invention are employed, any function which is symmetrical with respect to the inputs $x_i$ can be obtained. This can be verified as follows.

When a logic function $f(s)$ is realized according to the present invention, the negation thereof can be obtained easily. For this reason, generality of realization is not impaired even if it is assumed that $f(m) = 1$. Thus, in an algebraic sum of $$\sum_{f(s-1)<f(s)} M_s + \sum_{f(s-1)>f(s)} \bar{M}_s$$

when the number of $M_s$ satisfying $f(s-1) < f(s)$ is assumed to be $\nu$, and the number of $\bar{M}_s$ satisfying $f(s-1)>f(s)$ is assumed to be $\nu'$, $$\nu+\nu' \leq m$$

is obtained. Since each of the $M_s$ and $\bar{M}_s$ corresponds to either one of the above described $M_1$ through $M_m$ and $\bar{M}_1$ through $\bar{M}_m$, respectively, the corresponding functions are employed as inputs supplied from the first stage of the logic circuit according to the present invention to the second stage thereof, whereby $f(s)$ is positively realized in the $\nu th$ output line from the second stage of the logic circuit.

Figure 24A:
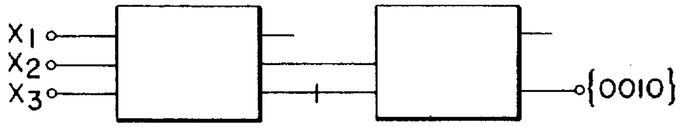
Figure 24B:
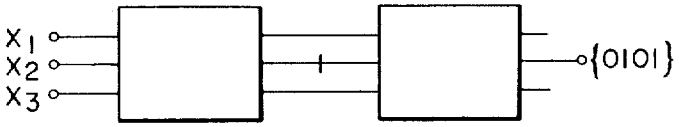
Figure 24C:
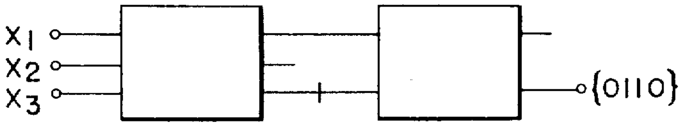

For instance, FIGS. 24(a), 24(b), 24(c) shows that (a) $\bar{x}_1x_2x_3 \vee x_1\bar{x}_2x_3 \vee x_1x_2\bar{x}_3 = N_2^3 = \{0010\}$ (b) $x_1 \oplus x_2 \oplus x_3 = N_1^3 \vee N_3^3 = \{101\}$ (c) $\bar{x}_1x_2 \vee \bar{x}_2x_3 \vee \bar{x}_3x_1 = N_1^3 \vee N_2^3 = \{0110\}$ are thereby realized respectively in accordance with this method.

In the logic circuit according to the present invention, negation of a variable or a function can be inserted at any position, and therefore, a logic function $f(x_1, x_2, \ldots, x_m)$, a negation thereof $\bar{f}$, a function for instance $f(\bar{x}_1, x_2, \ldots x_m)$ wherein some of the variables in the function $f(x_1, x_2, \ldots x_m)$ are negated, and still another function wherein the sequence of the variables are changed such as $f(x_2, x_1, x_3, \ldots x_m)$ are considered to be of substantially the same kind (these functions as described above being called functions in "the equivalent class").

Figure 25A:
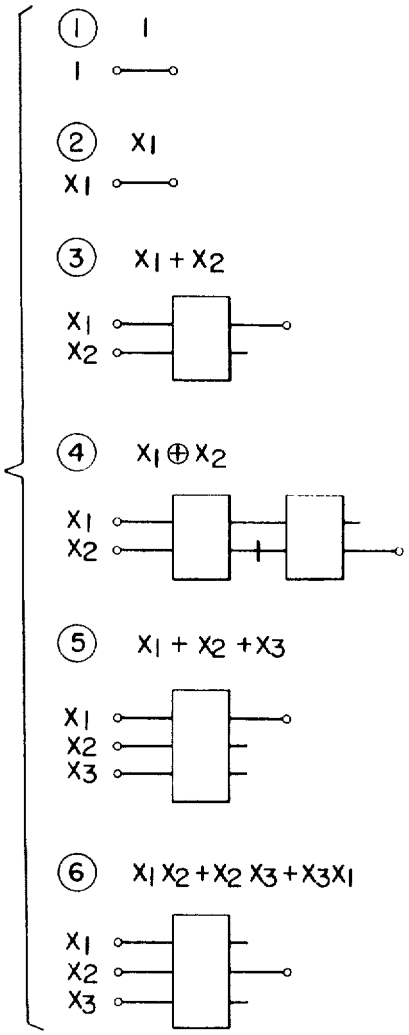
Figure 25B:
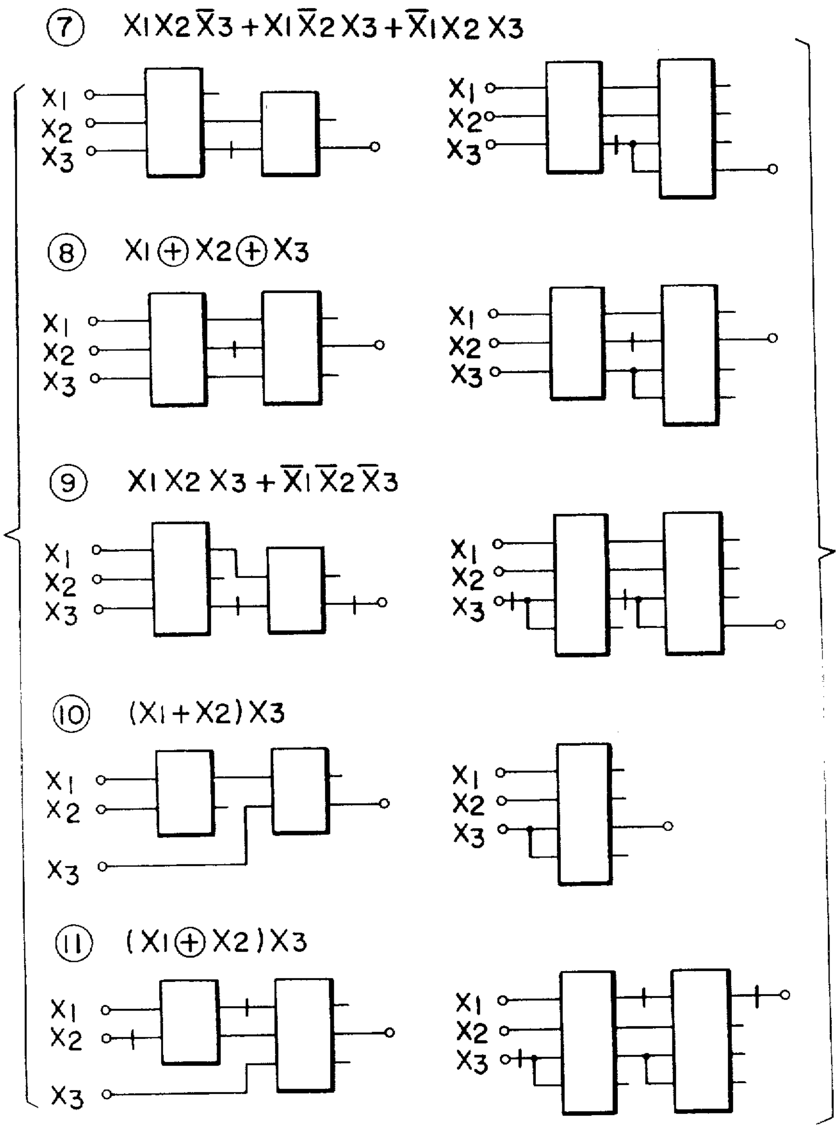
Figure 25C:
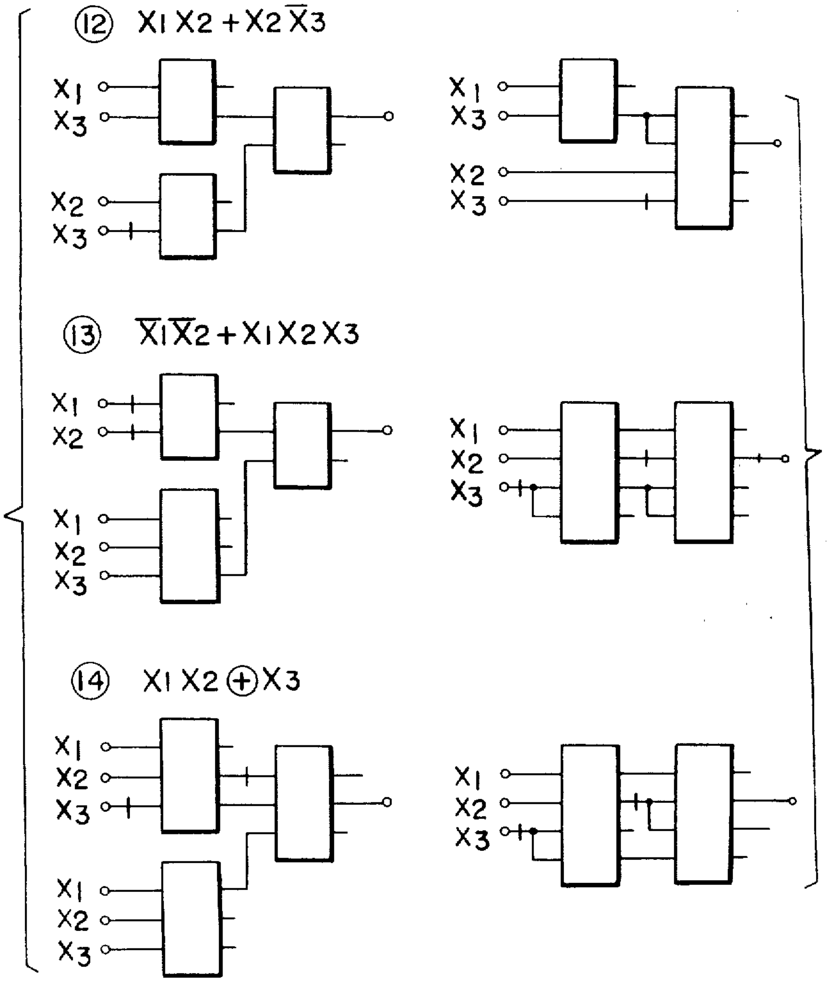

The logic circuit according to the present invention can also exhibit extensive versatility even if the functions are not symmetrical. FIG. 25 indicates cases wherein all of the representative 14 kinds of functions, which can be obtained by classifying all of the functions of three variables in accordance with the above described equivalence relations, are realized by the logic circuit according to the present invention.

Conclusively, only one circuit according to the present invention possessing $m$ inputs can simultaneously give all of the symmetrical and monotonous functions in respect to $m$ variables, and, as described above relative to the advantageous points of the present invention, all of the symmetrical functions of $m$ variables can be realized by two logic circuits according to the present invention, each having at most $m$ inputs. Furthermore, when functions of three variables are considered, all of the functions can be realized by not more than three logic circuits according to the present invention having at most three inputs, and all of the functions can also be realized by not more than two logic circuits of the present invention having at most four inputs.

Figure 26A:
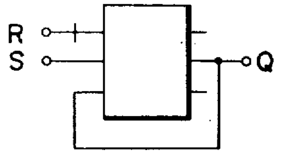
Figure 26B:
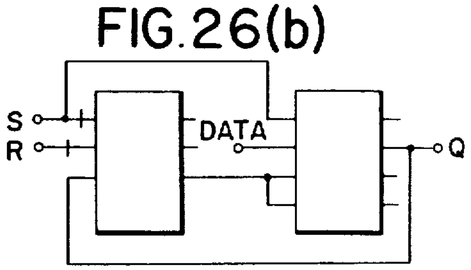
Figure 26C:
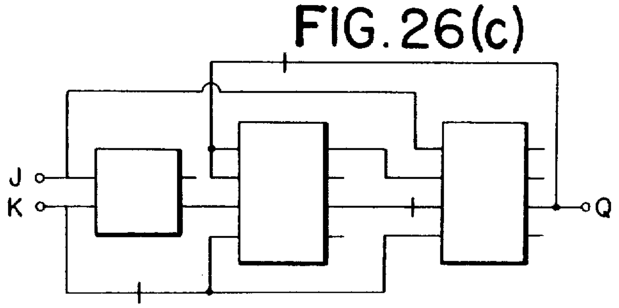

Although combination circuits according to the present invention have been disclosed in detail, it is known that a sequential circuit can be constituted by providing a suitable feedback in a combination circuit, and for this reason, obviously, sequential circuits are also included in the scope of the present invention. Since it is impossible to present all of the examples, the most typical examples thereof, for instance, an R-S flip-flop, gated R-S flip-flop, and J-K flip-flop are indicated in FIGS. 26(a), 26(b), and 26(c). In these figures, only, the reference characters ordinalily employed in the flip-flop techniques are employed.

Figure 27:
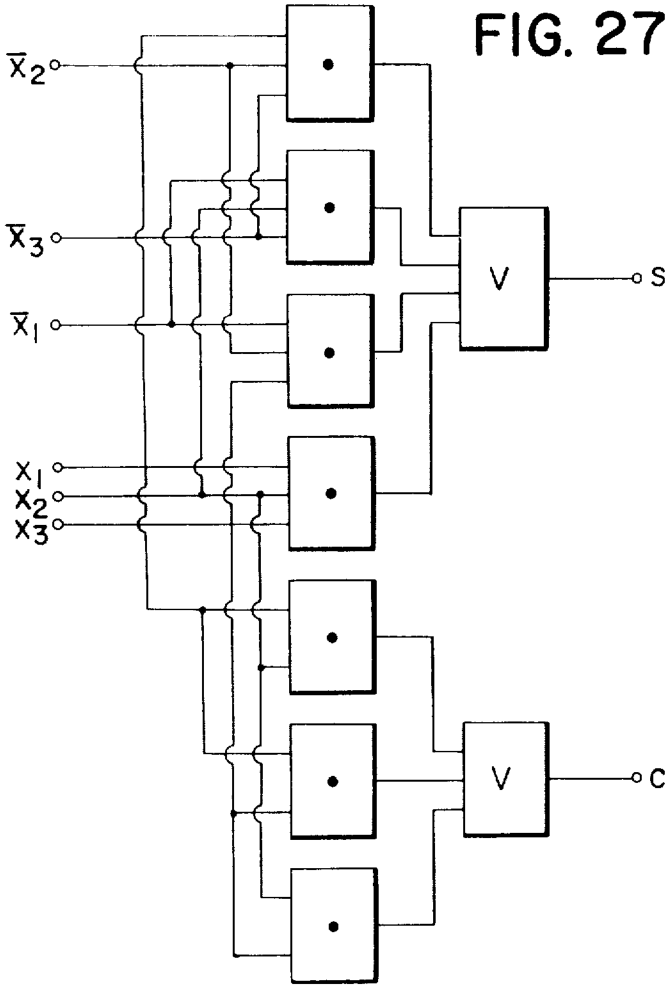
FIG. 27 is block diagram of a full-adder employing conventional logic circuits.

FIG. 27 shows an examples of a full adder with an organization employing conventional Boolean logic circuits. In this adder, symbol "." indicates an AND circuit, "V" indicates an OR circuit, $s$ designates a sum, and $c$ designates a carry to the next higher bit. This circuit has a complicated organization as indicated. FIG. 28 indicates a similar full adder realized by a logic circuit according to the present invention. In this case, the full adder is composed of only two completely similar basic module circuits $L_1$ and $L_2$, and the interconnection wirings for the inputs, outputs, and between the basic module circuits are also extremely simple.

Figure 29:
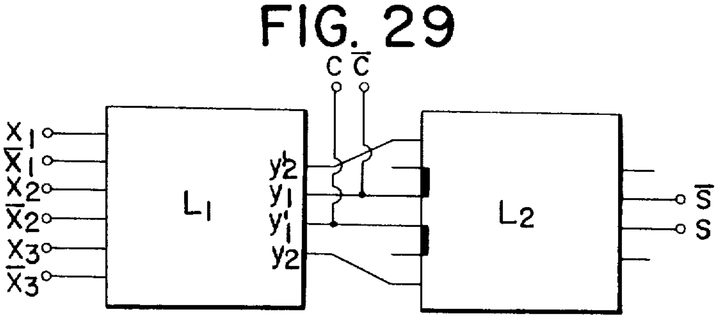
Figure 30:
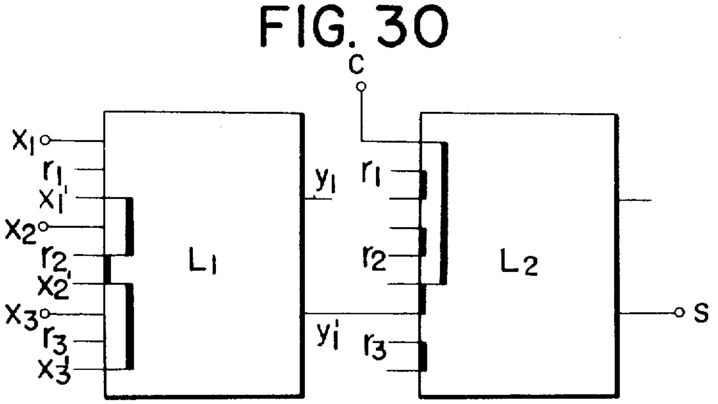

An actual wiring diagram of an example of a full-adder, wherein each of the basic modules $L_1$ and $L_2$ shown in FIG. 28 are formed by a logic circuit as indicated in FIG. 14 is illustrated in FIG. 29. Likewise, an actual wiring diagram of a full adder wherein the basic modules $L_1$ and $L_2$ thereof are made of a logic circuit as shown in FIG. 21 (wherein $m = 3$) is indicated in FIG. 30. In these diagrams, the wiring indicated by extremely heavy lines are the connections within each of the modules. When one package includes one module, these connections can be achieved merely by short-circuiting the corresponding pins of the module, and the connections thereof are much simplified. In a large scale integrated-circuit including a plurality of modules in one package, such connections can be realized by partly modifying the pattern of the internal wiring of the integrated-circuit, and outward connections are not required, whereby a further simplification of the wirings is attained.

Figure 31:
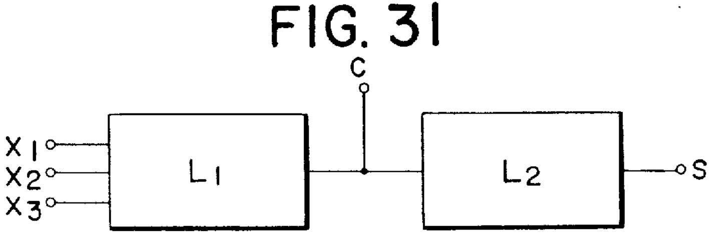

Since the part of the connections indicated by the extremely heavy lines add no complexity to the intra-module connections, when merely the wiring in the large scale logic circuit contributing to the complication thereof is taken into consideration, the circuit shown in FIG. 30 can be simplified as indicated in FIG. 31, and it will be apparent that almost no full adder can have a simpler connection than those in the circuit of FIG. 31.

Although typical embodiments of the present invention have been described hereinabove, it will be apparent that the invention is not restricted merely to these embodiments, but various modifications thereof may also be carried out. For example, although the cases (i) through (v) described above are considered to be good examples of combinations which make it possible to realize the advantageous features of the present invention to the effect that $2m$ logic functions consisting of $M_1$ through $M_m$ and $\bar{M}_1$ through $\bar{M}_m$ can be simultaneously obtained, the same logic functions may also be obtained, for instance, by employing $y_1$ through $y_{2n-1}$ and $y'_1$ instead of $y_1$ through $y_n$ and $y'_1$ through $y'_n$ employed in the cases of (i) and (ii), or by utilizing the voltage difference between $y_{k''}$ and $y'_{k'''}$ instead of the voltage difference between $y_k$ and $y'_{k'}$ in the same case, as long as the relation $k - k' = k'' - k'''$ is maintained. Furthermore, if some of the above described $2m$ logic functions are not necessary, the number of taps in the cases of (i) and (ii) or the number $l$ of taps in the cases of (iii) through (v) may be decreased. Also, if it is advantageous for the simplification of the interconnecting wirings, not only $y_1$ but also $y'_1$ may be employed for instance in the case of (v). In such a case, the difference between the cases (iii), (iv) and the case (v) is merely in the number $l$ of the reference voltages, and there may be cases where $m/2 < l < m$.

It will be obvious that the multiplexity feature of the invention is important, and the above described examples are provided with multiplexity. However, it will be apparent that the invention has ample novelty and utility even without multiplexity. For instance in the cases of (iii) through (v), only one reference voltages is used, and this one reference voltage is fixedly connected to the base of the transistors $Q'_{E_1}$ through $Q'_{E_m}$. Furthermore, $y_2$ through $y_m$ and $y'_2$ through $y'_m$ added to $y_1$ and $y'_1$, respectively, whereby the functions $M_1$ through $M_m$ and $\bar{M}_1$ through $\bar{M}_m$ can be realized by the $2m$ output terminals thus provided. In this case, the number of the interconnecting wires between modules is generally increased. However, $2m$ terminals consisting of terminals $x'_1$ through $x'_m$ and $r_1$ through $r_m$ become unnecessary, and, in some cases, the number of leadout pins from packages can be thereby reduced.

In the so far exhibited drawings, a network for obtaining reference voltages $V_{r_1}$ through $V_{r_l}$ and for supplying base potentials for the transistors $Q_{E_i}$, $Q_c$, $Q'_c$, $Q_v$, $Q'_v$, $Q_r$, etc. has been prepared for each module. However, this may also be simplified so that one of such networks is employed commonly for several of the modules or the power supply for these potentials may be commonly employed by providing wirings. On the other hand, for instance, in FIG. 2, $I_r$, $I_v$, $I_j$ are all supplied from a voltage source $E$. However, as is apparent from Eq. (36) through (38), it is not necessary that these supply voltages for the $I_r$, $I_v$, and $I_j$ be equal, and when economization of power consumption is required, separate voltage sources may also be employed for supplying these voltages regardless of the complication of the circuit. Likewise, the base potentials of the transistors $Q_{E_i}$, $Q_v$, and $Q_r$ may be different from each other.

Furthermore, in a logic circuit according to the present invention which may operate in the "single ended" manner, a plurality of transistors acting as current switches may be employed only at one side thereof as in the case of "CML", so that the OR operation may be carried out by these plurality of transistors themselves of a current switches.

Also, in the above description, the transistors are assumed to be of PNP-junction type. However, when NPN-type transistors are to be employed, the symbols P and N and the directions of all of the voltages and currents should be reversed, and when field-effect transistors are to be employed, the source, gate, and drain electrodes thereof should be connected in place of the emitter, base, and collector of the junction type transistors. Since it is apparent from the theoretical explanation of the invention that the purpose of the invention can be advantageously attained by employing current switches having a sufficiently high output internal impedance to the extent that analog summation of the output currents thereof can be thereby obtained, all of such types of current switches may be duly included within the scope of the present invention.

Summarizing the above description, the present invention relates to a logic circuit having unique features, which could not be obtained by any of the conventional logic circuits, whereby a multiple of output logic functions can be obtained simultaneously from a single basic logic circuit, and whereby a multiplex of logic signals can also be simultaneously delivered from a single output line of the basic logic circuit. Because of these features, the number of required basic logic circuits, required operational period, power consumption, price of the resultant equipment, required space, and weight thereof can be substantially reduced, and the reliability thereof can be significantly elevated.

Furthermore, due to these features of the present invention, a versatile logic circuit can be realized with substantially reduced interconnecting wirings and exhibiting conspicious advantages when the invention is applied to large-scale integrated circuits. Since all of these advantageous features of the present invention are obtained from a unique combination of linear addition and binary logic techniques, and because the individual circuit elements are similar to those of the conventional logic circuits, no specific difficulties, for instance in the production technique of the current switches, are added in the actual production of the logic circuit, and epoch making progress can be thereby expected in all fields of logic circuits ranging from those of extremely large size, of ultra-high-speed, and of extremely reliable type to those of minute power and of simple organization inclusive of the fundamental module, and also in the designing techniques relating to all logic circuit systems.

We claim:

1. A basic logic circuit for delivering logically two valued and physically multi-valued signals defined according to whether each of the output voltage differences thereof is positive or negative, comprising a plurality of current switches, each of which has at least two input terminals, and said basic logic circuit having at most two load resistors wherein output currents from said plurality of current switches are linearly added in a desired range, and at least one circuit positions having either one of a potential linearly related to an added output in either of said at most two load resistors whereby a plurality of logic signals and negations thereof as defined are delivered simultaneously, wherein each of said plurality of current switches consists of two portions each having an input, whereby a plurality of "median" functions consisting of from $M_1$ to $M_m$ and from $\bar{M}_1$ to $\bar{M}_m$ are obtained by said plurality of current switches and said at most two linearly adding load resistors, where a median function $M_j(x_1, x_2, \ldots, x_m)$ of $m$ binary variables is defined as follows:

$$Mj(x_1, x_2, \ldots x_m) = \begin{cases} 1 \text{ if } \sum_{i=1}^{m} x_i \geqq j \\ 0 \text{ if } \sum_{i=1}^{m} x_i < j (1 \leqq j \leqq m) \end{cases}$$

$$\bar{M}_j = 1 - M_j.$$

* * * * *